United States Patent
Kanamori et al.

(10) Patent No.: US 9,960,171 B2
(45) Date of Patent: May 1, 2018

(54) SEMICONDUCTOR DEVICES INCLUDING CHARGE STORAGE PATTERNS

(71) Applicants: Kohji Kanamori, Seoul (KR);
Shinhwan Kang, Seoul (KR);
Youngwoo Park, Seoul (KR);
Junghoon Park, Yongin-si (KR)

(72) Inventors: Kohji Kanamori, Seoul (KR);
Shinhwan Kang, Seoul (KR);
Youngwoo Park, Seoul (KR);
Junghoon Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/245,540

(22) Filed: Aug. 24, 2016

(65) Prior Publication Data
US 2017/0125428 A1    May 4, 2017

(30) Foreign Application Priority Data
Nov. 2, 2015   (KR) .................. 10-2015-0153269

(51) Int. Cl.
| H01L 27/115 | (2017.01) |
| H01L 29/788 | (2006.01) |
| H01L 29/792 | (2006.01) |
| H01L 27/11519 | (2017.01) |
| H01L 27/11565 | (2017.01) |
| H01L 27/11556 | (2017.01) |
| H01L 27/11582 | (2017.01) |
| H01L 27/11524 | (2017.01) |
| H01L 27/1157 | (2017.01) |

(52) U.S. Cl.
CPC .. *H01L 27/11519* (2013.01); *H01L 27/11556* (2013.01); *H01L 27/11565* (2013.01); *H01L 27/11582* (2013.01); *H01L 29/7889* (2013.01); *H01L 29/7926* (2013.01); *H01L 27/1157* (2013.01); *H01L 27/11524* (2013.01)

(58) Field of Classification Search
CPC ......... H01L 27/11519; H01L 27/11556; H01L 29/7889; H01L 29/7926
See application file for complete search history.

(56) References Cited

U.S. PATENT DOCUMENTS

| 8,349,681 | B2 | 1/2013 | Alsmeier et al. |
| 8,415,742 | B2 | 4/2013 | Kim et al. |
| 8,445,347 | B2 | 5/2013 | Alsmeier |
| 8,581,330 | B2 | 11/2013 | Kiyotoshi |
| 8,658,499 | B2 | 2/2014 | Makala et al. |
| 8,912,053 | B2 | 12/2014 | Yoo |
| 8,969,945 | B2 | 3/2015 | Kito et al. |

FOREIGN PATENT DOCUMENTS

| JP | 2014-53605 A | 3/2014 |
| KR | 10-2013-0102893 A | 9/2013 |
| KR | 10-2014-0009189 A | 1/2014 |

*Primary Examiner* — Thanh V Pham
(74) *Attorney, Agent, or Firm* — Myers Bigel, P.A.

(57) ABSTRACT

Semiconductor devices are provided. A semiconductor device includes a plurality of gate electrodes. The semiconductor device includes a channel structure adjacent the plurality of gate electrodes. The semiconductor device includes a plurality of charge storage segments between the channel structure and the plurality of gate electrodes. Methods of forming semiconductor devices are also provided.

15 Claims, 34 Drawing Sheets

SEMICONDUCTOR DEVICES INCLUDING CHARGE STORAGE PATTERNS

CROSS-REFERENCE TO RELATED APPLICATION

This U.S. non-provisional patent application claims priority under 35 U.S.C. § 119 to Korean Patent Application No. 10-2015-0153269, filed on Nov. 2, 2015, in the Korean Intellectual Property Office, the entire contents of which are hereby incorporated herein by reference.

BACKGROUND

The present disclosure relates to semiconductor devices. Higher integration of semiconductor devices may be used to respond to consumer demands for superior performance and inexpensive prices. In the case of semiconductor devices, since their integration may be a factor in determining product prices, increased integration may be advantageous. In the case of typical two-dimensional or planar semiconductor devices, since their integration is mainly determined by the area occupied by a unit memory cell, integration is greatly influenced by the level of a fine pattern forming technology. However, the extremely expensive process equipment often used to increase pattern fineness may set a practical limitation on increasing integration for two-dimensional or planar semiconductor devices.

To overcome such a limitation, three-dimensional (3D) semiconductor devices including three-dimensionally-arranged memory cells have been proposed. However, there are significant manufacturing obstacles in achieving low-cost, mass-production of 3D semiconductor memory devices, particularly in the mass-fabrication of 3D devices that maintain or exceed the operational reliability of their 2D counterparts.

SUMMARY

Some embodiments of present inventive concepts provide a semiconductor memory device with improved reliability.

Some embodiments of present inventive concepts provide a reduced-risk method of fabricating a highly-reliable semiconductor memory device.

A semiconductor device, according to some embodiments of present inventive concepts, may include a substrate. The semiconductor device may include a gate structure on the substrate. The gate structure may include gate lines that are stacked on the substrate and spaced apart from each other in a vertical direction. The semiconductor device may include a lower insulating pattern between the substrate and the gate structure. The semiconductor device may include a channel structure that extends through the gate structure and into the lower insulating pattern. The semiconductor device may include charge storage patterns between the channel structure and the gate lines. The semiconductor device may include a lower charge storage pattern between the channel structure and the lower insulating pattern. The charge storage patterns may be spaced apart from each other by first recess regions that are between the gate lines. Moreover, the lower charge storage pattern may be spaced apart from a nearest one of the charge storage patterns by a second recess region that is between the lower insulating pattern and the gate structure.

In some embodiments, the lower charge storage pattern may include a first portion between a sidewall of the channel structure and a sidewall of the lower insulating pattern. The first portion may extend in the vertical direction. Moreover, the lower charge storage pattern may include a second portion between the substrate and the channel structure. The second portion may extend in a direction parallel to a top surface of the substrate.

According to some embodiments, the channel structure may include a bottom surface that is between bottom and top surfaces of the lower insulating pattern in the vertical direction. Additionally or alternatively, the device may include an insulating layer filling the first and second recess regions.

In some embodiments, the lower insulating pattern may include a first thickness, and each of the gate lines may include a second thickness. The first thickness may be thicker than the second thickness. Moreover, the substrate may include a trench in a top portion thereof and adjacent a side of the gate structure. The trench may include a width greater than the first thickness.

According to some embodiments, the device may include a tunnel layer between the channel structure and the lower charge storage pattern and between the channel structure and the charge storage patterns. The tunnel layer may contact a sidewall of the channel structure.

In some embodiments, the device may include blocking patterns that are respectively between the lower insulating pattern and the lower charge storage pattern and between the gate lines and the charge storage patterns. One of the blocking patterns may extend onto top and bottom surfaces of an adjacent one of the gate lines.

According to some embodiments, the substrate may include a lower semiconductor pattern that protrudes beyond a surface of the substrate. The channel structure may contact a top surface of the lower semiconductor pattern. Moreover, the device may include a ground selection line between the substrate and the lower insulating pattern. The lower semiconductor pattern may extend through the ground selection line.

A semiconductor device, according to some embodiments, may include a substrate. The semiconductor device may include a gate structure on the substrate. The gate structure may include gate lines that are stacked on the substrate and spaced apart from each other in a vertical direction. The semiconductor device may include an upper insulating pattern on the gate structure. The semiconductor device may include a channel structure in the upper insulating pattern and the gate structure and coupled to the substrate. The semiconductor device may include charge storage patterns between the channel structure and the gate lines. The semiconductor device may include an upper charge storage pattern between the channel structure and the upper insulating pattern. The charge storage patterns may be spaced apart from each other by first recess regions between the gate lines. Moreover, the upper charge storage pattern may be spaced apart from the gate structure by a second recess region between the upper insulating pattern and the gate structure.

In some embodiments, the channel structure may include a semiconductor material and a conductive material on the semiconductor material. The upper charge storage pattern may be between a sidewall of the conductive material and a sidewall of the upper insulating pattern and extends in the vertical direction.

According to some embodiments, the device may include an insulating layer filling the first and second recess regions. Additionally or alternatively, the upper insulating pattern may include a first thickness, and each of the gate lines may include a second thickness. The first thickness may be thicker than the second thickness. Moreover, the substrate may include a trench therein adjacent a side of the gate structure. The trench may include a width greater than the first thickness.

In some embodiments, the device may include a tunnel layer between the channel structure and the upper charge storage pattern and between the channel structure and the charge storage patterns. The tunnel layer may contact a sidewall of the channel structure.

According to some embodiments, the device may include blocking patterns that are respectively between the upper insulating pattern and the upper charge storage pattern and between the gate lines and the charge storage patterns. Additionally or alternatively, the substrate may include a lower semiconductor pattern that protrudes beyond a surface of the substrate. The channel structure may contact a top surface of the lower semiconductor pattern.

A semiconductor device, according to some embodiments, may include a substrate. The semiconductor device may include a lower insulating pattern. The semiconductor device may include a gate structure that includes a plurality of gate lines. The semiconductor device may include an upper insulating pattern. The lower insulating pattern, the gate structure, and the upper insulating pattern may be sequentially stacked on the substrate. The semiconductor device may include an insulating layer filling spaces between the lower insulating pattern, the gate lines, and the upper insulating pattern. The semiconductor device may include a channel structure in the upper insulating pattern, the gate structure, and the lower insulating pattern. The semiconductor device may include a lower charge storage pattern between the channel structure and the lower insulating pattern. The semiconductor device may include charge storage patterns between the channel structure and the gate lines. The semiconductor device may include an upper charge storage pattern between the channel structure and the upper insulating pattern.

The lower charge storage pattern, the charge storage patterns, and the upper charge storage pattern may be vertically spaced apart from each other with the insulating layer interposed therebetween.

In some embodiments, the lower charge storage pattern may include a first portion between a sidewall of the channel structure and a sidewall of the lower insulating pattern. The first portion may extend in a vertical direction. The lower charge storage pattern may include a second portion between the substrate and the channel structure. The second portion may extend in a direction parallel to a top surface of the substrate.

According to some embodiments, the upper charge storage pattern may be between a sidewall of the channel structure and a sidewall of the upper insulating pattern and extends in a vertical direction. Additionally or alternatively, the upper and lower insulating patterns may include first and second thicknesses, respectively, that are thicker than any of the gate lines.

In some embodiments, the device may include a tunnel layer that is between the channel structure and the upper charge storage pattern. The tunnel layer may be between the channel structure and the charge storage patterns. The tunnel layer may be between the channel structure and the lower charge storage pattern. Moreover, the tunnel layer may contact a sidewall of the channel structure.

According to some embodiments, the device may include a first blocking layer between the upper insulating pattern and the upper charge storage pattern. The device may include a second blocking layer between one of the gate lines and an adjacent one of the charge storage patterns. Moreover, the device may include a third blocking layer between the lower insulating pattern and the lower charge storage pattern.

In some embodiments, the substrate may include a lower semiconductor pattern that protrudes beyond a surface of the substrate. The channel structure may contact a top surface of the lower semiconductor pattern.

A method of fabricating a semiconductor device, according to some embodiments, may include forming a lower gate layer on a substrate. The method may include alternately and repeatedly stacking first insulating layers and gate layers on the lower gate layer. A first thickness of each of the gate layers may be thinner than a second thickness of the lower gate layer. The method may include forming a channel hole through the first insulating layers, the gate layers, and the lower gate layer to expose a portion of a surface of the substrate. The method may include forming a charge storage layer and a channel structure in the channel hole. The method may include replacing the gate layers with gate lines. The method may include replacing the lower gate layer with a lower insulating pattern. Moreover, the method may include selectively patterning the charge storage layer to form charge storage patterns between the channel structure and the gate lines and to form a lower charge storage pattern between the channel structure and the lower insulating pattern.

In some embodiments, the method may include laterally etching sidewalls of the first insulating layers through the channel hole to form laterally recessed regions. The method may include forming sacrificial patterns in the laterally recessed regions. Selectively patterning the charge storage layer may include removing the sacrificial patterns to expose portions of the charge storage layer. Moreover, selectively patterning the charge storage pattern may include removing the portions of the charge storage layer that are exposed.

According to some embodiments, the removing of the sacrificial patterns may be performed after the gate layers and the lower gate layer are replaced with the gate lines and the lower insulating pattern, respectively. Additionally or alternatively, coplanar ones of the sacrificial patterns may be connected to each other to form a single body that extends around the channel hole.

In some embodiments, the method may include forming a second insulating layer to fill regions from which the sacrificial patterns are removed. Additionally or alternatively, the method may include performing a selective epitaxial growth process to form a lower semiconductor pattern on the portion of the surface of the substrate that is exposed by the channel hole. The lower semiconductor pattern may include a top surface between bottom and top surfaces of the lower gate layer.

According to some embodiments, replacing the gate layers with the gate lines and replacing the lower gate layer with the lower insulating pattern may include removing the lower gate layer and the gate layers to form a first gap region and second gap regions, respectively. The replacing may include forming a conductive layer in the first and second gap regions. The replacing may include etching the conductive layer to remove the conductive layer from the first gap region and to form the gate lines in the second gap regions. Moreover, the replacing may include forming the lower insulating pattern in the first gap region.

In some embodiments, the method may include, after forming the channel structure, patterning the first insulating layers, the gate layers, and the lower gate layer to form a layered pattern extending in a direction. The forming of the layered pattern may be performed to form a trench in a top portion of the substrate and at a side of the layered pattern. Moreover, the trench may extend in the direction and may include a width greater than a thickness of the lower gate layer.

A semiconductor device, according to some embodiments, may include a stack of a plurality of gate electrodes. The semiconductor device may include a channel structure adjacent respective sidewalls of the plurality of gate electrodes. The semiconductor device may include a plurality of discrete charge storage segments between the channel structure and the respective sidewalls of the plurality of gate electrodes. The semiconductor device may include a bit line overlapping the stack. The semiconductor device may include an insulating material between the bit line and the stack. The semiconductor device may include a charge storage material between the channel structure and a sidewall of the insulating material. The charge storage material and the insulating material may be at a level of the semiconductor device that is free of any gate electrode.

In some embodiments, the charge storage material may be thicker than any of the plurality of discrete charge storage segments. Moreover, the insulating material may be thicker than any of the plurality of gate electrodes.

According to some embodiments, the semiconductor device may include a substrate. The insulating material may include an upper insulating layer. The semiconductor device may include a lower insulating layer between the substrate and the stack. The charge storage material may include an uppermost charge storage segment. Moreover, the semiconductor device may include a lowermost charge storage segment between the channel structure and a sidewall of the lower insulating layer.

In some embodiments, the semiconductor device may include an inter-gate insulating layer that includes a thickness between adjacent ones of the plurality of gate electrodes that is thinner than a thickness of the upper insulating layer and thinner than a thickness of the lower insulating layer.

According to some embodiments, the channel structure may be one among a plurality of channel structures on a first region of the substrate. The substrate may include a second region that is spaced apart from the first region by a trench in the substrate by a distance that is greater than the thickness of the upper insulating layer and greater than the thickness of the lower insulating layer. The semiconductor device may include a first gate layer on the second region of the substrate. The semiconductor device may include a second gate layer stacked on the first gate layer. Moreover, the semiconductor device may include an insulating layer between the first and second gate layers. A width of the insulating layer may be narrower than a width of the first gate layer and narrower than a width of the second gate layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
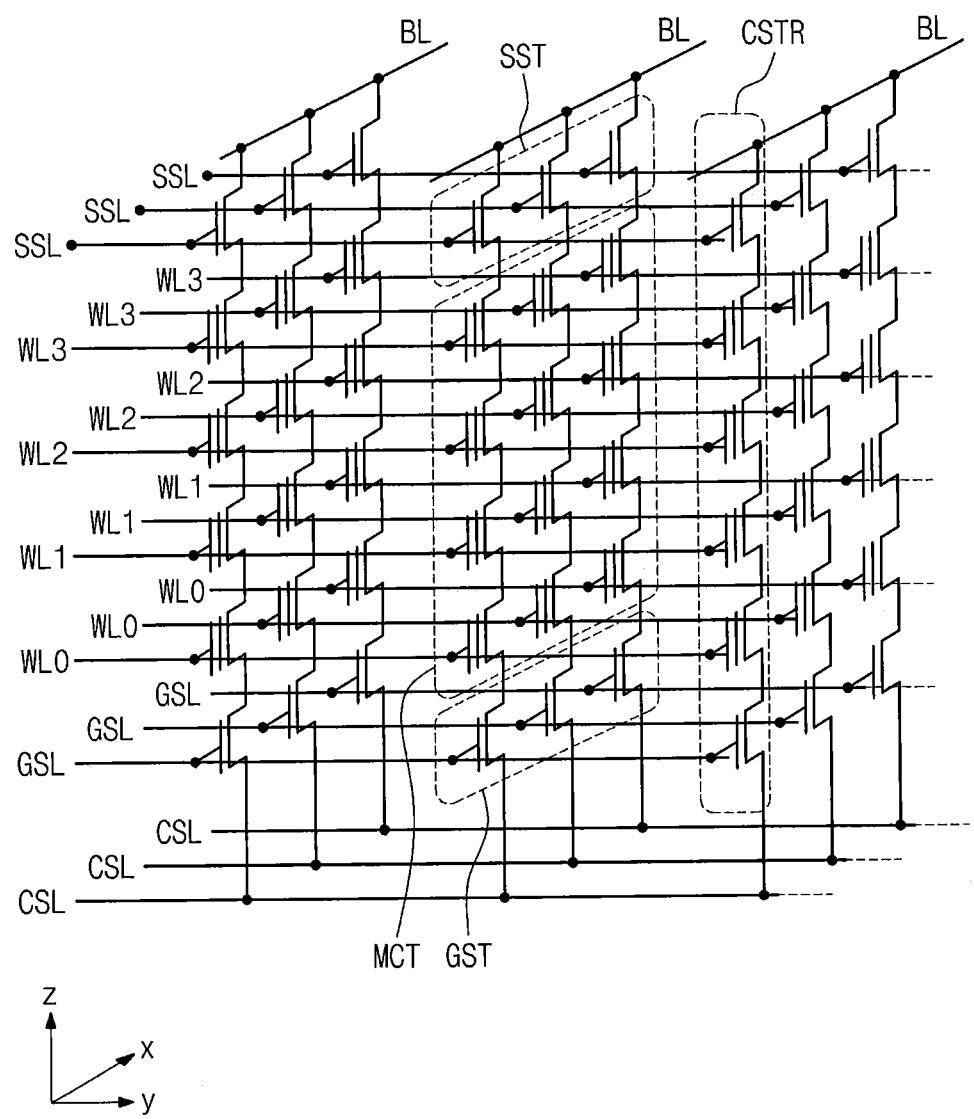
FIG. 1 is a circuit diagram schematically illustrating a cell array of a three-dimensional semiconductor memory device according to some embodiments of present inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise.

It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a circuit diagram schematically illustrating a cell region of a three-dimensional semiconductor memory device according to some embodiments of present inventive concepts.

Referring to FIG. 1, a cell array of a three-dimensional semiconductor memory device may include a common source line CSL, a plurality of bit lines BL, and a plurality of cell strings CSTR disposed between the common source line CSL and the bit lines BL.

The common source line CSL may be a conductive pattern disposed on a substrate or an impurity region formed in the substrate. In some embodiments, the common source line CSL may be a conductive pattern (e.g., a metal line) that is provided on and vertically spaced apart from the substrate. The bit lines BL may be conductive patterns (e.g., metal lines) that are provided on and vertically spaced apart from the substrate. In some embodiments, the bit lines BL may be provided to cross the common source line CSL and may be vertically spaced apart from the common source line CSL. The bit lines BL may be two-dimensionally arranged and a plurality of the cell strings CSTR may be connected in parallel to each of the bit lines BL. The cell strings CSTR may be connected in common to the common source line CSL. For example, a plurality of the cell strings CSTR may be disposed between the bit lines BL and the common source line CSL. A plurality of common source lines CSL may be two-dimensionally provided on the substrate. In some embodiments, the common source lines CSL may be applied with the same voltage. Alternatively, the common source lines CSL may be separated from each other and may thereby be independently controlled.

Each of the cell strings CSTR may include a ground selection transistor GST coupled to the common source line CSL, a string selection transistor SST coupled to the bit line BL, and a plurality of memory cell transistors MCT disposed between the ground and string selection transistors GST and SST. Furthermore, the ground selection transistor GST, the string selection transistor SST, and the memory cell transistors MCT may be connected in series.

The common source line CSL may be connected in common to source regions of the ground selection transistors GST. Furthermore, at least one ground selection line GSL, a plurality of word lines WL0-WL3, and a plurality of string selection lines SSL may be disposed between the common source line CSL and the bit lines BL and may serve as gate electrodes of the ground selection transistor GST, the memory cell transistors MCT, and the string selection transistors SST, respectively. In addition, each of the memory cell transistors MCT may include a data storage element.

Figure 2:
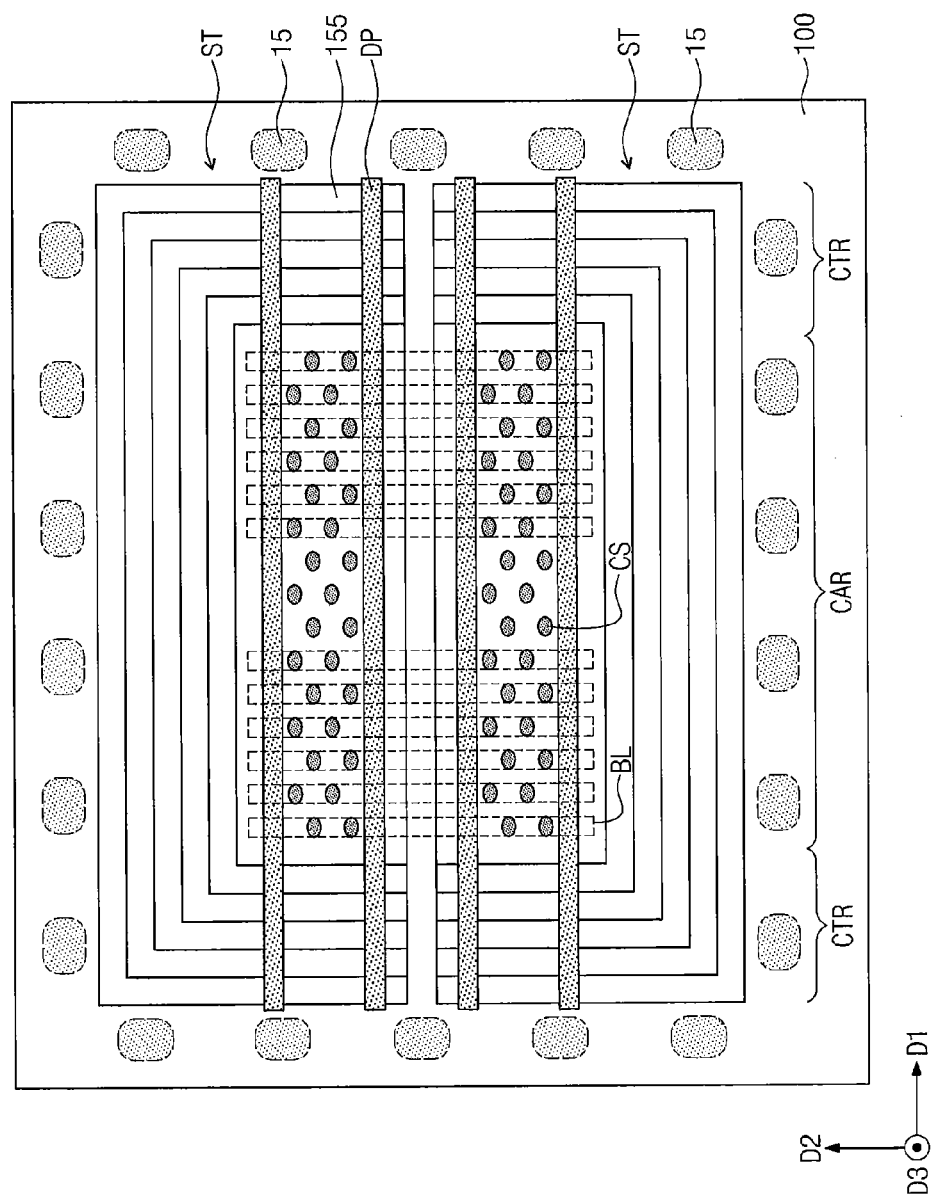
FIG. 2 is a plan view illustrating a cell region of a three-dimensional semiconductor memory device according to some embodiments of present inventive concepts.

FIG. 2 is a plan view illustrating a cell region of a three-dimensional semiconductor memory device according to some embodiments of present inventive concepts.

Referring to FIG. 2, a semiconductor substrate 100 may include a cell array region CAR and a contact region CTR provided near the cell array region CAR. A plurality of stacks ST may be provided on the semiconductor substrate 100 to extend in a first direction D1 and parallel to each other. A plurality of channel structures CS may be provided to pass through each of the stacks ST. Each of the stacks ST may include a gate structure GS consisting of a plurality of gate lines 155 vertically stacked on the semiconductor substrate 100. This will be described in more detail below.

Each of the stacks ST may be provided to have a stepwise structure on the contact region CTR, and the stepwise structure may make it possible to electrically connect the gate lines 155 to peripheral circuits. In other words, a vertical height of the stack ST may increase in a direction from the contact region CTR toward the cell array region CAR. For example, the stack ST may have a sloped profile in the contact region CTR.

Bit lines BL may be provided on the stacks ST to cross the stacks ST and extend in a second direction D2. Each of the bit lines BL may be electrically connected to a plurality of the channel structures CS.

The channel structures CS may be provided to pass through the stacks ST and may be electrically connected to the semiconductor substrate 100. When viewed in a plan view, the channel structures CS may be disposed to form a zigzag arrangement in the first direction Dl.

Common source regions DP may be provided. The common source regions DP may extend in the first direction D1 and parallel to each other. The stacks ST and the common source regions DP may be alternately and repeatedly arranged in the second direction D2.

Well pick-up regions 15 may be provided around the stacks ST. The well pick-up regions 15 may be provided adjacent to a sidewall of the lowermost one of the gate lines 155. The well pick-up regions 15 may be disposed spaced apart from each other. The well pick-up regions 15 may have the same conductivity type as a well region of the semiconductor substrate 100.

Figure 3:
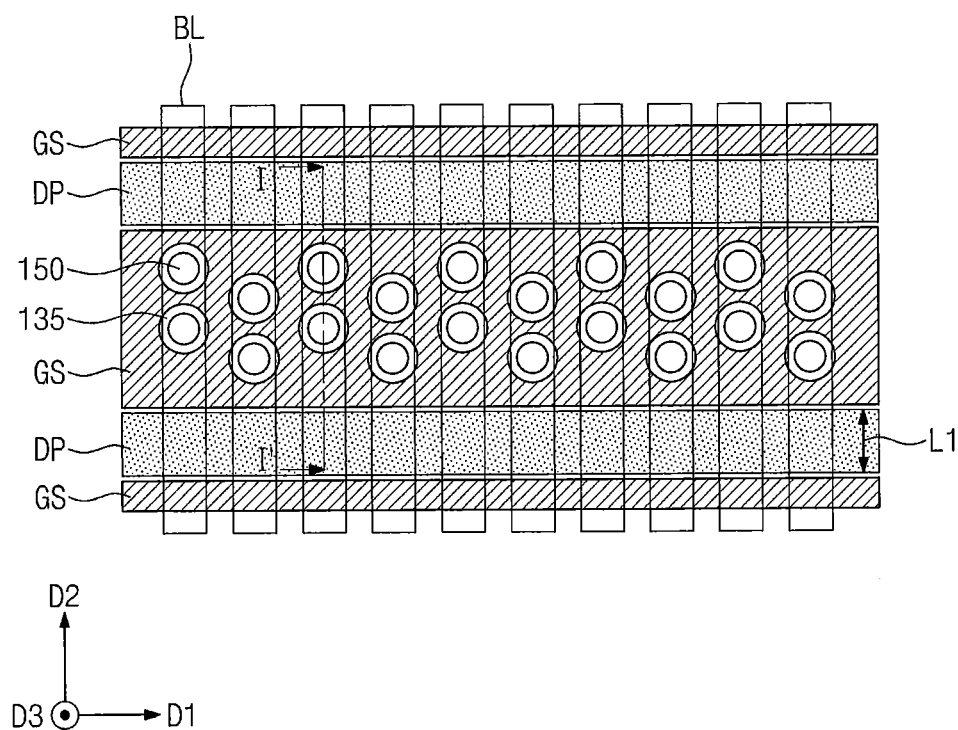
FIG. 3 is a plan view illustrating a portion (e.g., a cell array region of FIG. 2) of a three-dimensional semiconductor memory device according to some embodiments of present inventive concepts.
Figure 4:
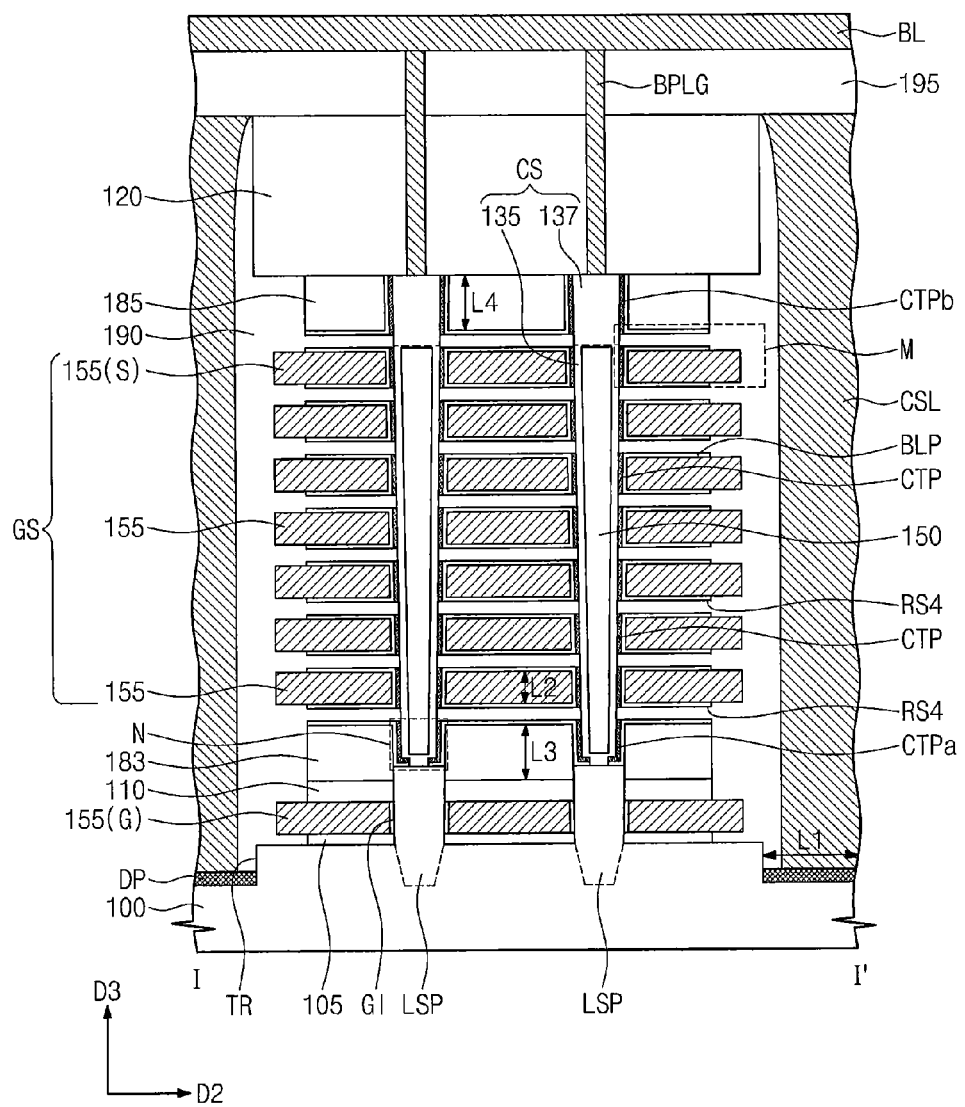
FIG. 4 is a sectional view taken along line I-I' of FIG. 3.
Figure 5A:
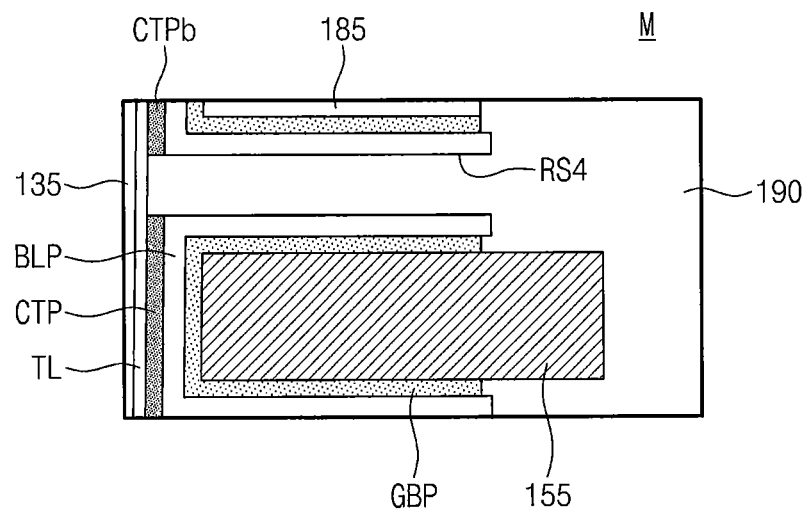
FIG. 5A is an enlarged sectional view of a portion/region 'M' of FIG. 4.
Figure 5B:
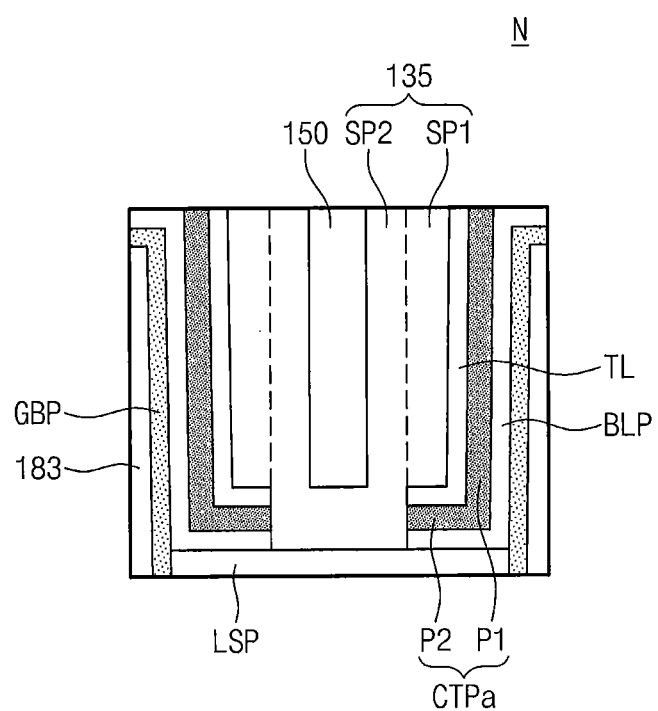
FIG. 5B is an enlarged sectional view of a portion/region 'N' of FIG. 4.

FIG. 3 is a plan view illustrating a portion (e.g., the cell array region CAR of FIG. 2) of a three-dimensional semiconductor memory device according to some embodiments of present inventive concepts. FIG. 4 is a sectional view taken along line I-I' of FIG. 3. FIG. 5A is an enlarged sectional view of a portion/region 'M' of FIG. 4, and FIG. 5B is an enlarged sectional view of a portion/region 'N' of FIG. 4.

Referring to FIGS. 3, 4, 5A, and 5B, a plurality of gate lines 155 constituting a gate structure GS may be stacked on a substrate 100. The gate lines 155 may be word lines WL. The substrate 100 may be a silicon substrate, a germanium substrate, or a silicon-germanium substrate. The substrate 100 may include common source regions DP doped with impurities. The common source regions DP may be a line-shaped structure extending in a first direction D1 and may be arranged in a second direction D2 crossing the first direction D1.

In some embodiments, a plurality of the gate structures GS may be provided, but hereinafter, one of the gate structures GS will be described as a representative example of the gate structures GS. When viewed in a plan view, the gate structure GS may be a line-shaped structure extending in the first direction Dl. Trenches TR may be formed on the substrate 100 and at both sides of the gate structure GS. The common source regions DP may be provided in the trenches TR, respectively. Each of the trenches TR may be provided to have a first width L1 in the second direction D2.

The gate lines 155 of the gate structure GS may be stacked/arranged in a third direction D3 orthogonal to both of the first and second directions D1 and D2 and may be vertically spaced apart from each other. Each of the gate lines 155 may have a second thickness L2. Here, the second thickness L2 may be smaller than the first width L1. A bottom gate line 155(G) may be further provided between each of the gate structures GS and the substrate 100.

In some embodiments, the bottom gate line 155(G) may serve as a gate electrode of the ground selection transistor GST described with reference to FIG. 1. Each of the gate structures GS may further include a top gate line 155(S), which may serve as a gate electrode of the string selection transistor SST described with reference to FIG. 1. The gate lines 155 positioned between the bottom gate line 155(G) and the top gate line 155(S) may serve as gate electrodes of the memory cell transistors MCT described with reference to FIG. 1. The gate lines 155 may be formed of or include at least one of metals (e.g., tungsten), metal nitrides, or metal silicides.

A lower insulating layer 105 may be provided between the substrate 100 and the bottom gate line 155(G), and a first insulating layer 110 may be provided between the bottom gate line 155(G) and the gate structure GS. The lower insulating layer 105 may be formed of or include at least one of a silicon nitride layer or high-k dielectric layers (e.g., aluminum oxide or hafnium oxide). The first insulating layer 110 may be formed of or include silicon oxide. The lower insulating layer 105 may be thinner than the first insulating layer 110.

A lower insulating pattern 183 may be provided between the first insulating layer 110 (as well as the bottom gate line 155(G)) and the gate structure GS, and an upper insulating pattern 185 may be provided on the top gate line 155(S). When viewed in a plan view, each of the lower and upper insulating patterns 183 and 185 may be a line-shaped structure extending along the gate structure GS or in the first direction D1. The lower insulating pattern 183 may have a third thickness L3, and the upper insulating pattern 185 may have a fourth thickness L4. The third thickness L3 and the fourth thickness L4 may be different from or equal to each other. The lower and upper insulating patterns 183 and 185 may be formed of or include silicon oxide.

Both of the third and fourth thicknesses L3 and L4 may be smaller than the first width L1. If, on the other hand, both of the third and fourth thicknesses L3 and L4 were greater than or equal to the first width L1, then voids could be formed in the lower and upper insulating patterns 183 and 185.

Both of the third and fourth thicknesses L3 and L4 may be greater than the second thickness L2. If, on the other hand, the third and fourth thicknesses L3 and L4 were smaller than or equal to the second thickness L2, then the gate lines 155, instead of the lower and upper insulating patterns 183 and 185, could be formed. In such a case, a short circuit could occur on lower semiconductor patterns LSP and bit line plugs BPLG, as will be described below.

Lower semiconductor patterns LSP may be provided on the substrate 100. In some embodiments, the lower semiconductor patterns LSP may be upper portions of the substrate 100. The lower semiconductor patterns LSP may extend upward from the top surface of the substrate 100 and may pass through the lower insulating layer 105, the bottom gate line 155(G), and the first insulating layer 110. Each of the lower semiconductor patterns LSP may be partially inserted into a bottom portion of the lower insulating pattern 183. In other words, the lower semiconductor patterns LSP may have top surfaces that are positioned between bottom and top surfaces of the lower insulating pattern 183.

The lower semiconductor patterns LSP may be formed of or include a semiconductor material, whose conductivity type is the same as that of the substrate 100. In some embodiments, the lower semiconductor patterns LSP may be epitaxial patterns grown using the substrate 100 as a seed layer. In this case, the lower semiconductor patterns LSP may have a single- or poly-crystalline structure.

A plurality of channel structures CS may be electrically connected to the substrate 100 through the upper insulating pattern 185, the gate structure GS, and the lower insulating pattern 183. When viewed in a plan view, the channel structures CS may be arranged in the first direction D1. In some embodiments, the channel structures CS may be disposed to have a zigzag arrangement in the first direction D1.

Each of the channel structures CS may include a channel pillar 135 and a conductive pad 137 on the channel pillar 135. The channel pillar 135 may be provided to cover an inner surface of the gate structure GS. The channel pillar 135 may be a top-open pipe or macaroni structure. The channel pillar 135 may have a bottom portion that is in direct contact with the top surface of the lower semiconductor pattern LSP. The conductive pad 137 may have a top surface that is substantially coplanar with the top surface of the upper insulating pattern 185.

The channel pillar 135 may be in an undoped state or may be doped to have the same conductivity type as the substrate 100. As an example, the channel pillar 135 may include a semiconductor material (e.g., silicon) having a poly- or single-crystalline structure. An internal/interior space of the channel pillar 135 may be filled with an insulating gapfill pattern 150. The conductive pad 137 may be formed of or include at least one of doped semiconductor materials or conductive materials. As an example, the conductive pad 137 may be formed of a silicon layer, which is doped to have the same conductivity type as the substrate 100.

Hereinafter, gap regions between the gate lines 155 of the gate structure GS will be referred to as fourth recess regions RS4. Gap regions between the gate structure GS and the lower insulating pattern 183 and between the gate structure GS and the upper insulating pattern 185 may also be referred to as the fourth recess regions RS4. A second insulating layer 190 may be provided to fill the fourth recess regions RS4.

Charge storage/storing patterns CTP may be provided between the channel structure CS and the gate lines 155. A lower charge storage pattern CTPa may be provided between the channel structure CS and the lower insulating pattern 183, and an upper charge storage pattern CTPb may be provided between the channel structure CS and the upper insulating pattern 185. The upper charge storage pattern CTPb may be interposed between a sidewall of the conductive pad 137 and an inner sidewall of the upper insulating pattern 185, and in some embodiments, it may be extended in the third direction D3. The charge storage patterns CTP and the lower and upper charge storage patterns CTPa and CTPb may be vertically spaced apart from each other by the fourth recess regions RS4. Since the charge storage patterns CTP are spaced apart from each other in the third direction D3, it may be possible to impede/prevent electric charges (e.g., data) stored in the charge storage patterns CTP from being moved or diffused into other of the charge storage patterns CTP.

The lower and upper charge storage patterns CTPa and CTPb and the lower and upper insulating patterns 183 and 185 may be at levels (e.g., levels/planes that extend in the direction D2) of the semiconductor device that are free of any gate line 155. In particular, the lower and upper insulating patterns 183 and 185 may be used instead of (i.e., in the place of) gate lines 155. The charge storage patterns CTP, CTPa, and CTPb may be referred to herein as respective discrete charge storage segments. For example, each of the charge storage patterns CTP may be discontinuous in the direction D3 with respect to the other charge storage patterns CTP. Moreover, the lower charge storage pattern CTPa and/or the upper charge storage pattern CTPb may be referred to herein as a charge storage material.

Blocking patterns BLP may be provided between the charge storage patterns CTP and the gate lines 155. The blocking patterns BLP may be provided between the lower and upper charge storage patterns CTPa and CTPb and the lower and upper insulating patterns 183 and 185, respectively. The blocking pattern BLP between the channel structure CS and the gate line 155 may be extended to at least partially cover top and bottom surfaces of the gate line 155. The blocking pattern BLP between the channel structure CS and the lower insulating pattern 183 may be extended to cover a top surface of the lower insulating pattern 183. The blocking pattern BLP between the channel structure CS and the upper insulating pattern 185 may be extended to cover a bottom surface of the upper insulating pattern 185. The blocking patterns BLP may be vertically spaced apart from each other by the fourth recess regions RS4.

Referring again to FIGS. 5A and 5B, a tunnel layer TL may be interposed between the channel structure CS and the charge storage patterns CTP and between the channel structure CS and the lower and upper charge storage patterns CTPa and CTPb. The tunnel layer TL may be provided to directly cover the sidewall of the channel structure CS. In other words, the tunnel layer TL may be a pipe-shaped or macaroni-shaped structure with an open top and bottom.

In some embodiments, the channel pillar 135 may include a first semiconductor pillar SP1 and a second semiconductor pillar SP2, which are connected to each other and constitute a single body. The first semiconductor pillar SP1 may be provided to enclose an outer sidewall of the second semiconductor pillar SP2. The second semiconductor pillar SP2 may include a bottom portion that passes through a bottom portion of the first semiconductor pillar SP1 and is directly connected to the lower semiconductor pattern LSP. In other words, the second semiconductor pillar SP2 may be provided to pass through the tunnel layer TL, the lower charge storage pattern CTPa, and the blocking pattern BLP.

The blocking pattern BLP between the channel pillar 135 and the lower insulating pattern 183 may be provided to directly cover a portion of the top surface of the lower semiconductor pattern LSP. The tunnel layer TL may be provided to directly cover a bottom surface of the first semiconductor pillar SP1. The lower charge storage pattern CTPa may include a first portion P1, which is interposed between the sidewall of the channel pillar 135 and the inner sidewall of the lower insulating pattern 183 and extends in the third direction D3. In addition, the lower charge storage pattern CTPa may further include a second portion P2, which is interposed between the substrate 100 and the channel pillar 135 and extends parallel to the top surface of the substrate 100.

Each of the charge storage patterns CTP may be used as a part/portion of a memory element of FLASH memory device. In other words, the charge storage patterns CTP may be configured to store electric charges therein. Data stored in the charge storage patterns CTP may be changed using a Fowler-Nordheim (FN) tunneling effect caused by a voltage difference between the channel pillar 135 and the gate lines 155.

In some embodiments, the charge storage patterns CTP and the lower and upper charge storage patterns CTPa and CTPb may be formed of or include a silicon nitride layer, a silicon oxynitride layer, or a silicon-rich nitride layer. The tunnel layer TL may be formed of or include a material whose band gap is greater than that of the charge storage patterns CTP. As an example, the tunnel layer TL may include a silicon oxide layer. In some embodiments, the blocking patterns BLP may be formed of or include silicon oxide.

Gate barrier patterns GBP may be interposed between the blocking patterns BLP and the gate lines 155. The gate barrier patterns GBP may protect/prevent a metallic material in the gate lines 155 from being diffused into the blocking patterns BLP. The gate barrier patterns GBP may include at least one of various metal oxide materials (e.g., aluminum oxide or hafnium oxide).

Referring again to FIGS. 3 and 4, a third insulating layer 120 may be provided on the upper insulating pattern 185. In some embodiments, the second insulating layer 190 may be provided to cover a sidewall of the third insulating layer 120. Furthermore, the second insulating layer 190 may be provided to cover an outer sidewall of the gate structure GS. An interlayer insulating layer 195 may be provided on the third insulating layer 120. Each of the second and third insulating layers 190 and 120 and the interlayer insulating layer 195 may be formed of or include a silicon oxide layer.

Common source lines CSL may be provided at both sides of the second insulating layer 190 and may be electrically connected to the common source regions DP, respectively. When viewed in a plan view, the common source lines CSL may be disposed between the gate structures GS and may extend in the first direction D1.

Bit lines BL may be provided on the interlayer insulating layer 195 to cross the gate structures GS. The bit lines BL may be connected to respective ones of the conductive pads 137 through bit line plugs BPLG. The common source lines CSL, the bit line plugs BPLG, and the bit lines BL may be formed of or include at least one of metallic materials (e.g., tungsten, aluminum, or copper).

FIGS. 6, 8, 11, 13, 15, 18, 20, 23, and 25 are plan views illustrating a method of fabricating of a three-dimensional semiconductor memory device according to some embodiments of present inventive concepts.

FIGS. 7, 12, 14, 16A, 19, and 24A are sectional views taken along line I-I' of FIGS. 6, 11, 13, 15, 18, and 23, respectively.

Figure 8:
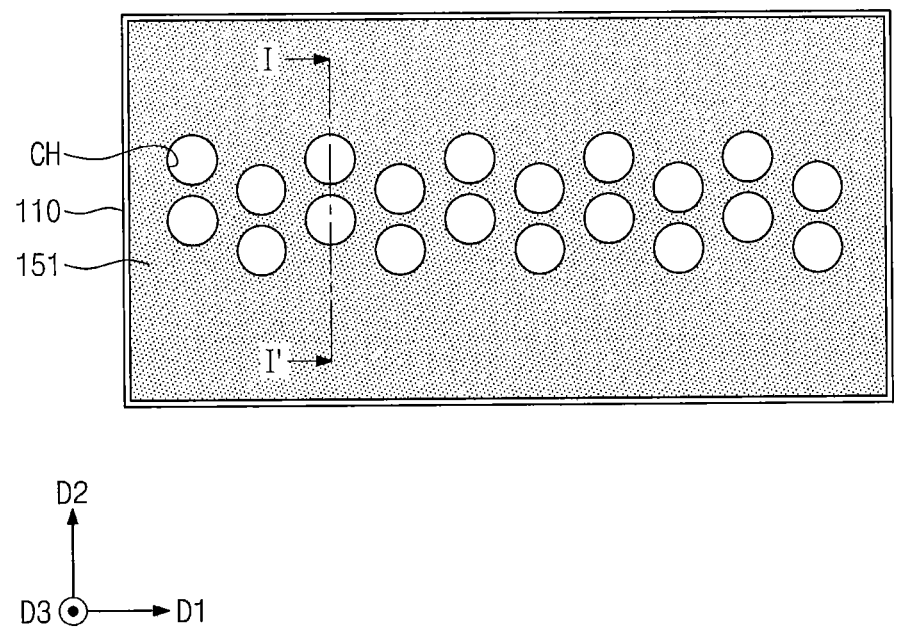
Figure 9:
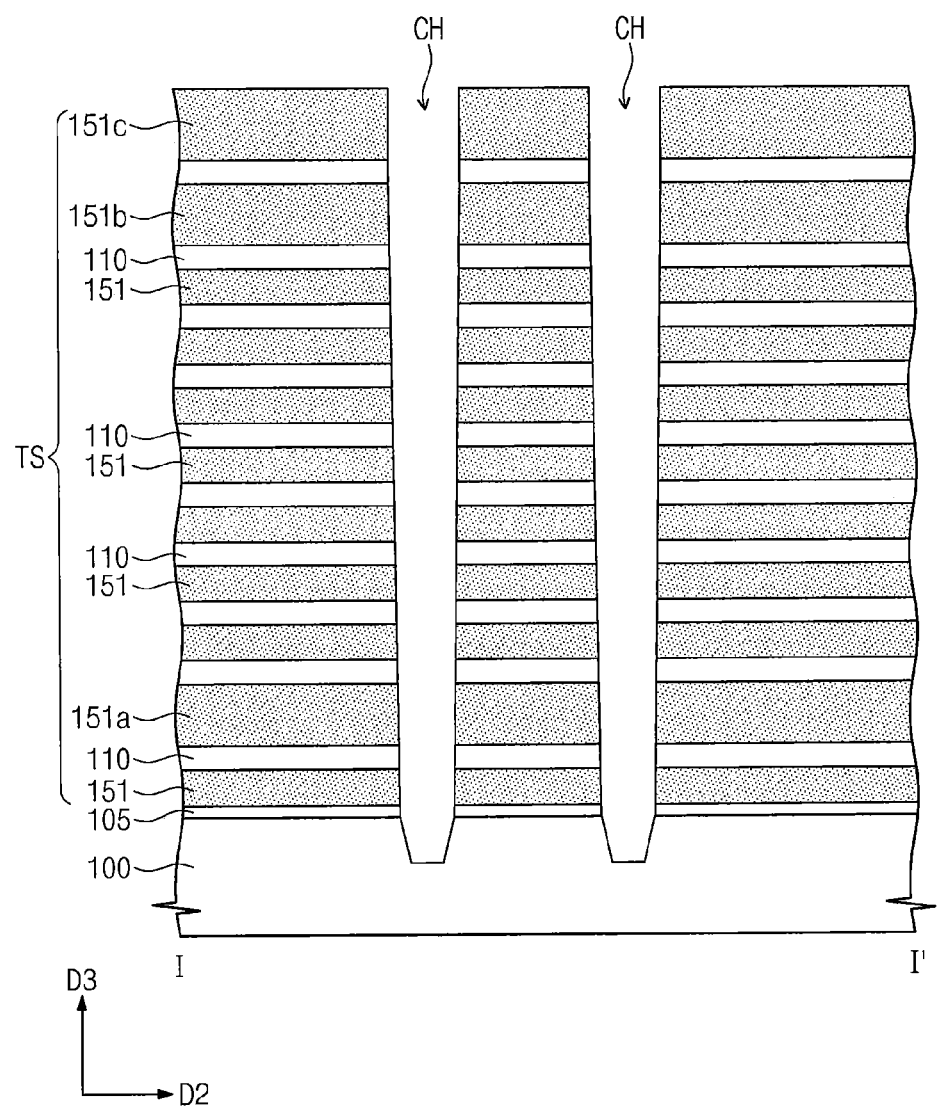
FIGS. 9 and 10 are sectional views taken along line I-I' of FIG. 8.
Figure 10:
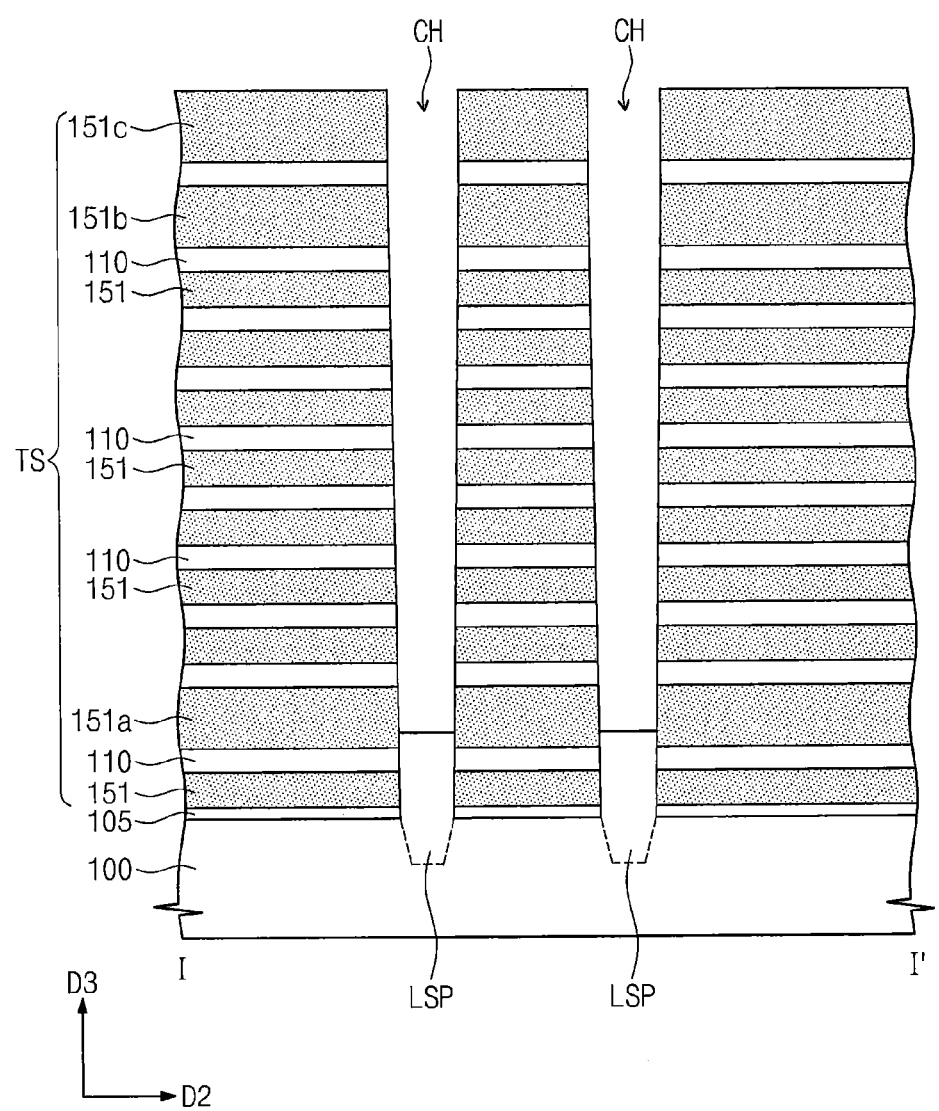

FIGS. 9 and 10 are sectional views taken along line I-I' of FIG. 8.

Figure 15:
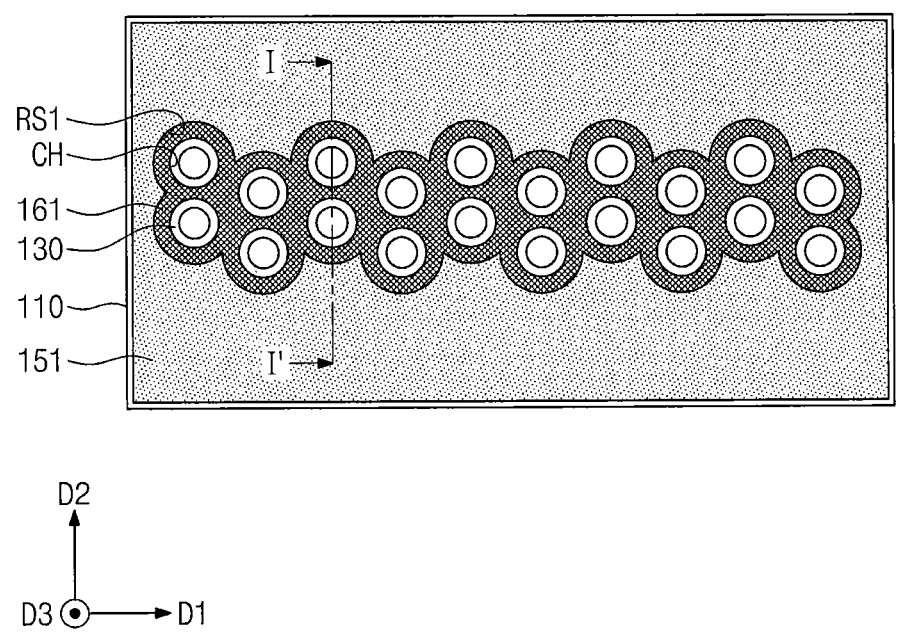
Figure 17:
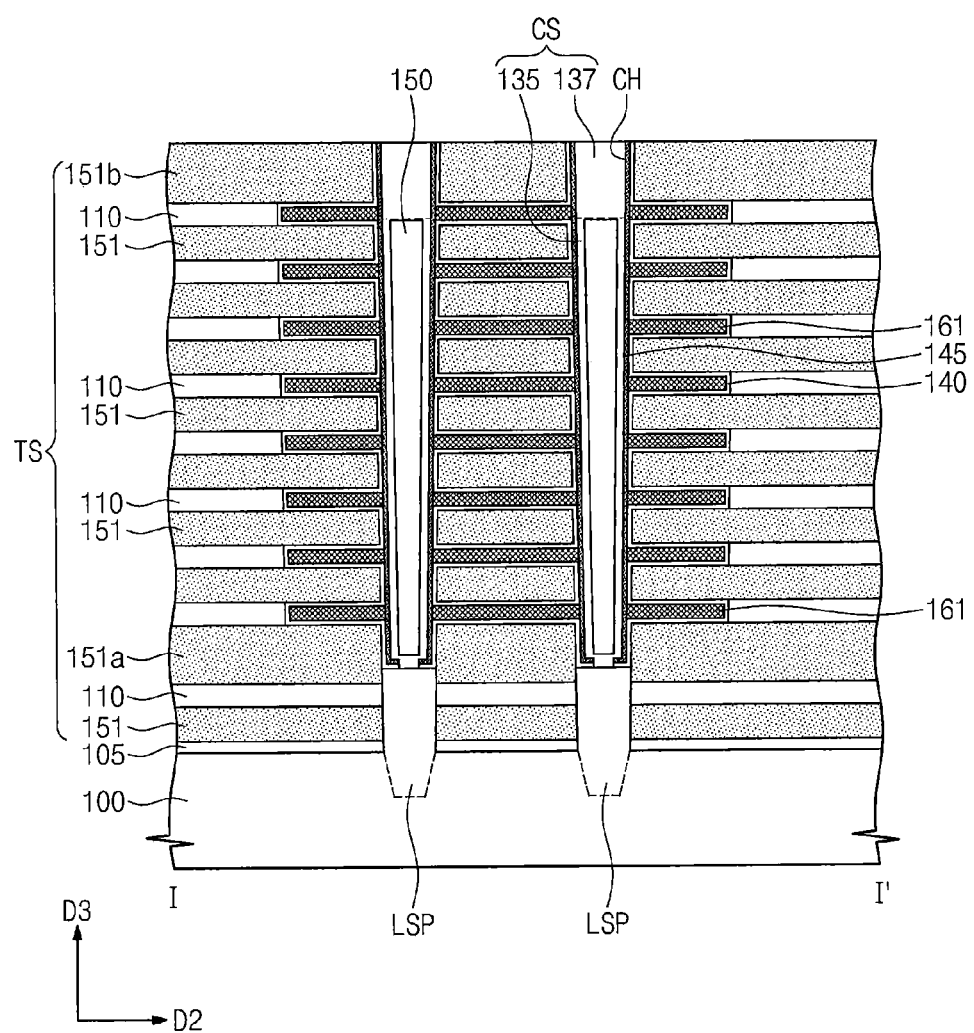
FIG. 17 is a sectional view taken along line I-I' of FIG. 15.

FIG. 17 is a sectional view taken along line I-I' of FIG. 15.

Figure 20:
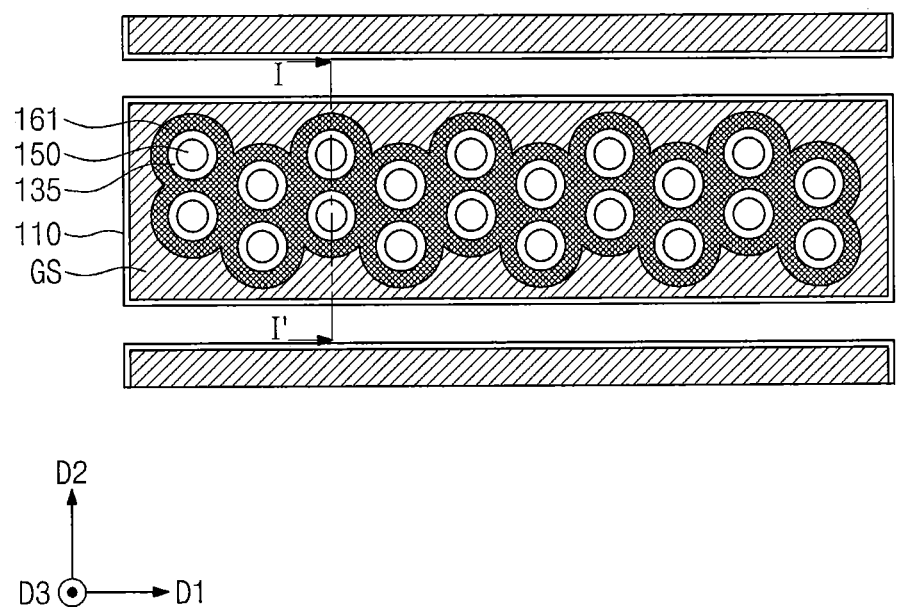
Figure 21A:
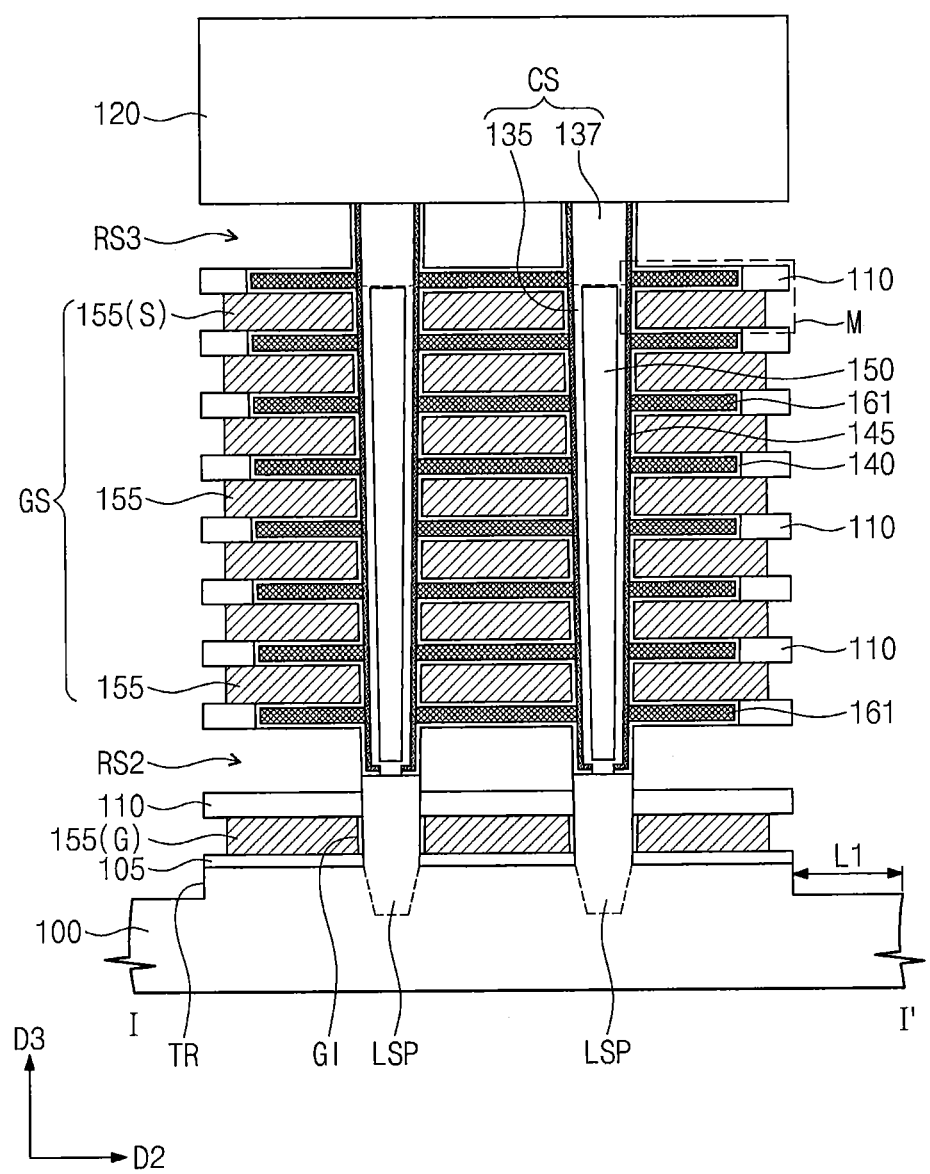
FIGS. 21A and 22A are sectional views taken along line I-I' of FIG. 20.
Figure 22A:
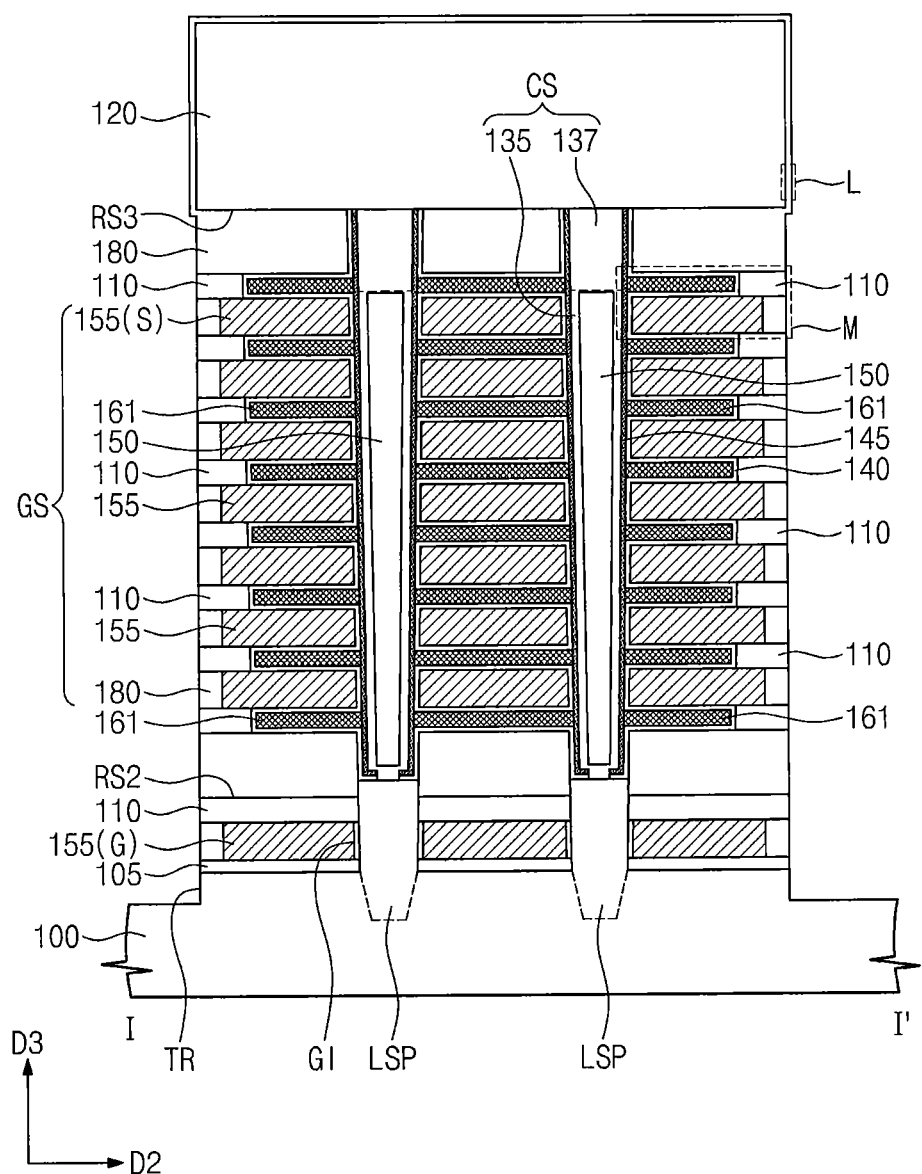

FIGS. 21A and 22A are sectional views taken along line I-I' of FIG. 20.

Figure 25:
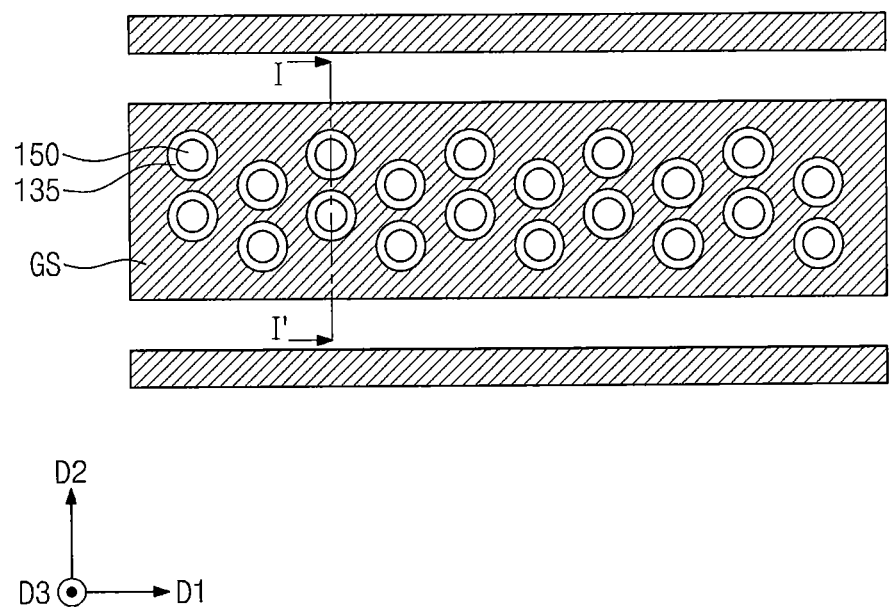
Figure 26A:
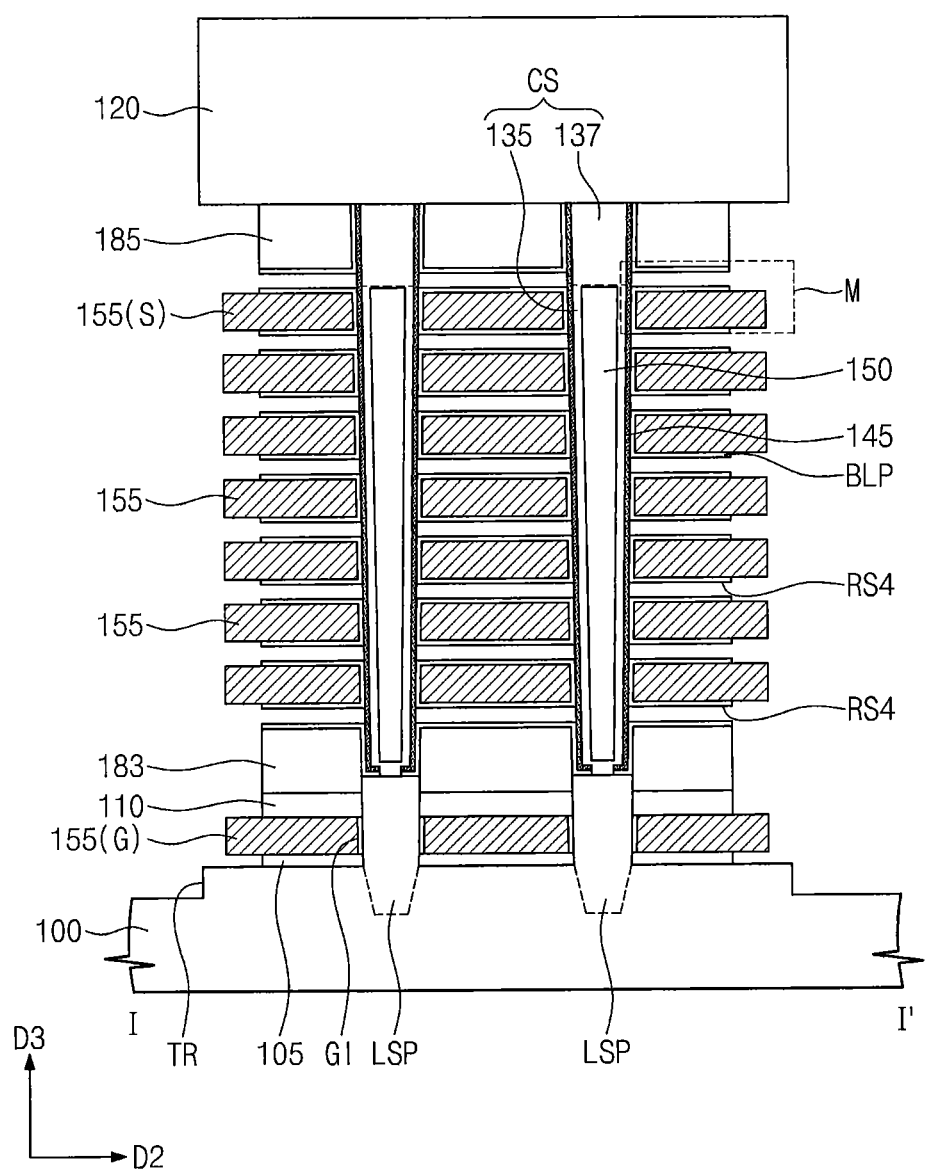
FIGS. 26A and 27A are sectional views taken along line I-I' of FIG. 25.
Figure 26B:
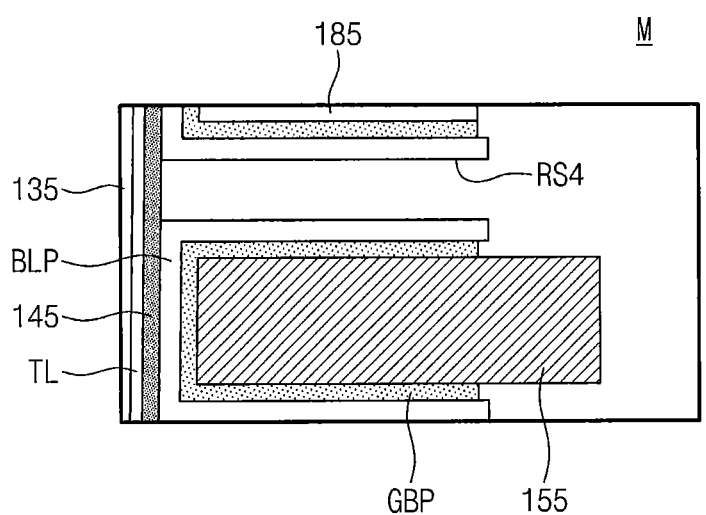
Figure 27A:
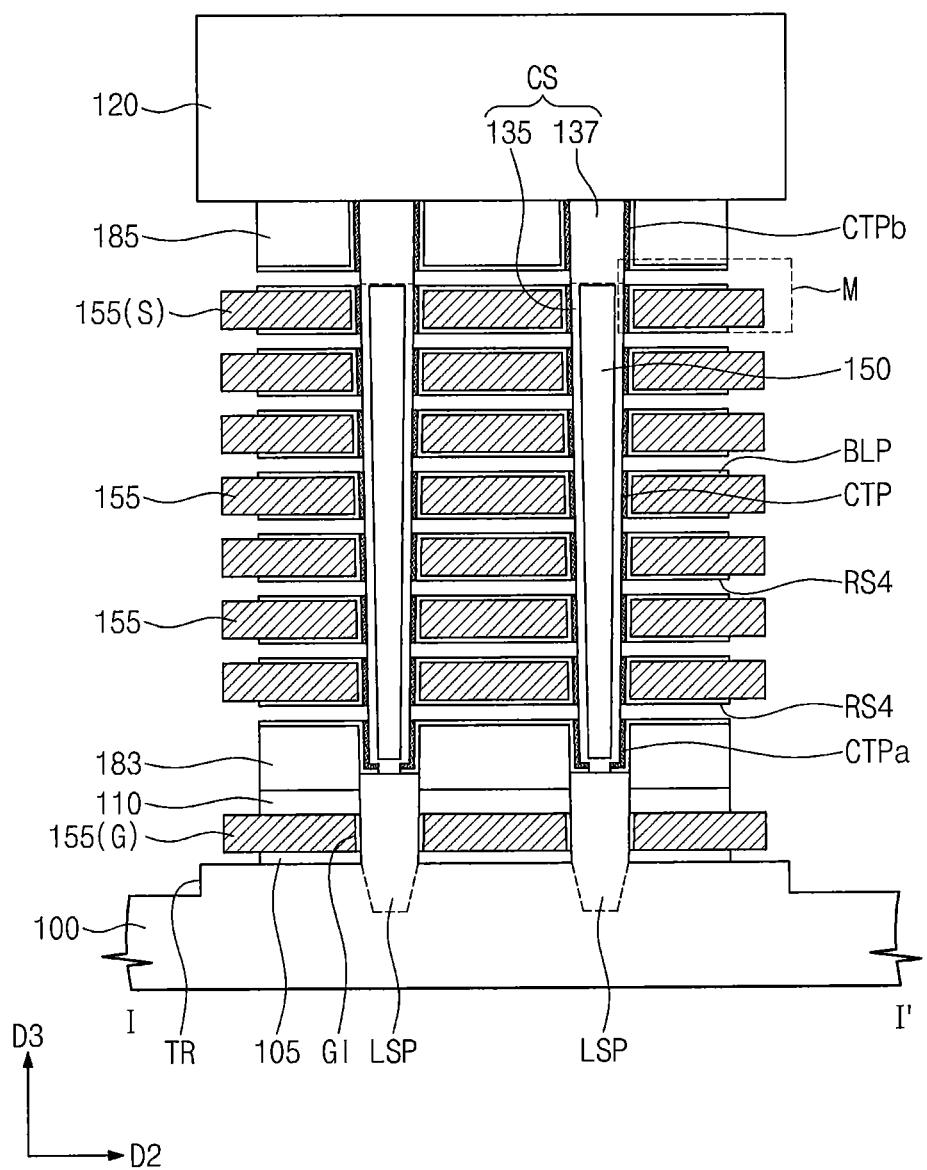

FIGS. 26A and 27A are sectional views taken along line I-I' of FIG. 25.

Figure 26C:
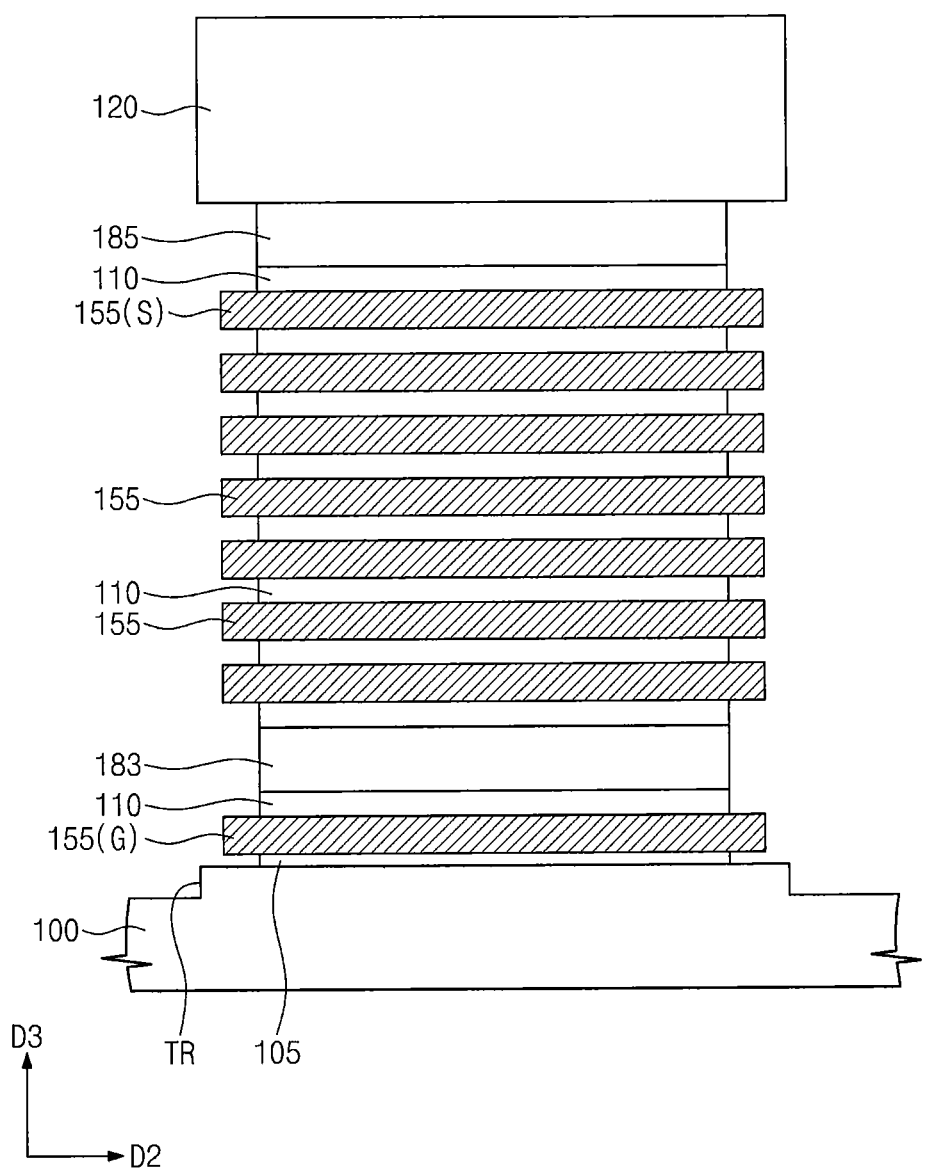
FIG. 26C is a sectional view illustrating a contact region of FIG. 2.

FIGS. 16B, 21B, 22B, 24B, 26B, and 27B are enlarged sectional views illustrating regions 'M' of FIGS. 16A, 21A, 22A, 24A, 26A, and 27A, respectively. FIG. 22C is an enlarged sectional view of a portion/region 'L' of FIG. 22A. FIG. 26C is a sectional view illustrating the contact region CTR of FIG. 2.

Figure 6:
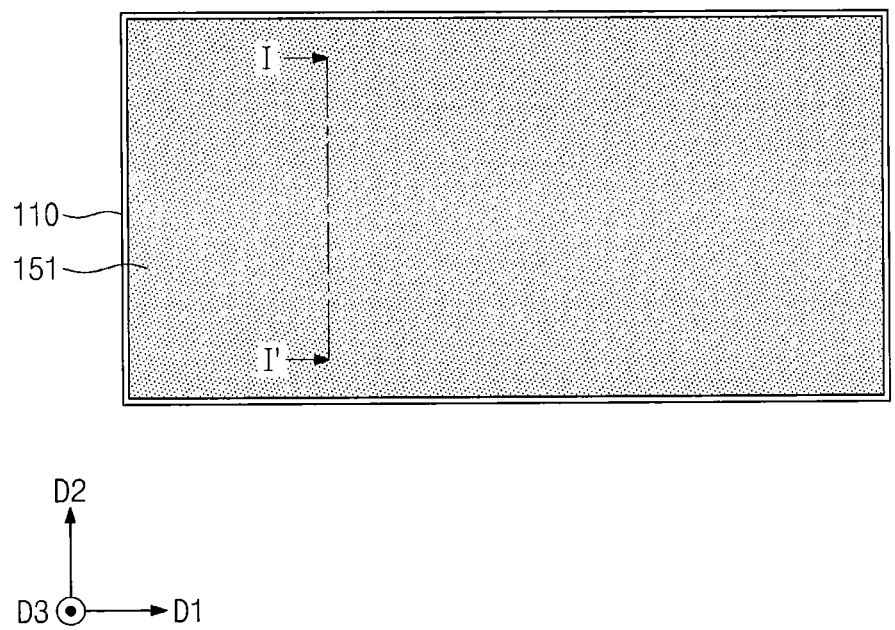
FIGS. 6, 8, 11, 13, 15, 18, 20, 23, and 25 are plan views illustrating a method of fabricating of a three-dimensional semiconductor memory device according to some embodiments of present inventive concepts.
Figure 7:
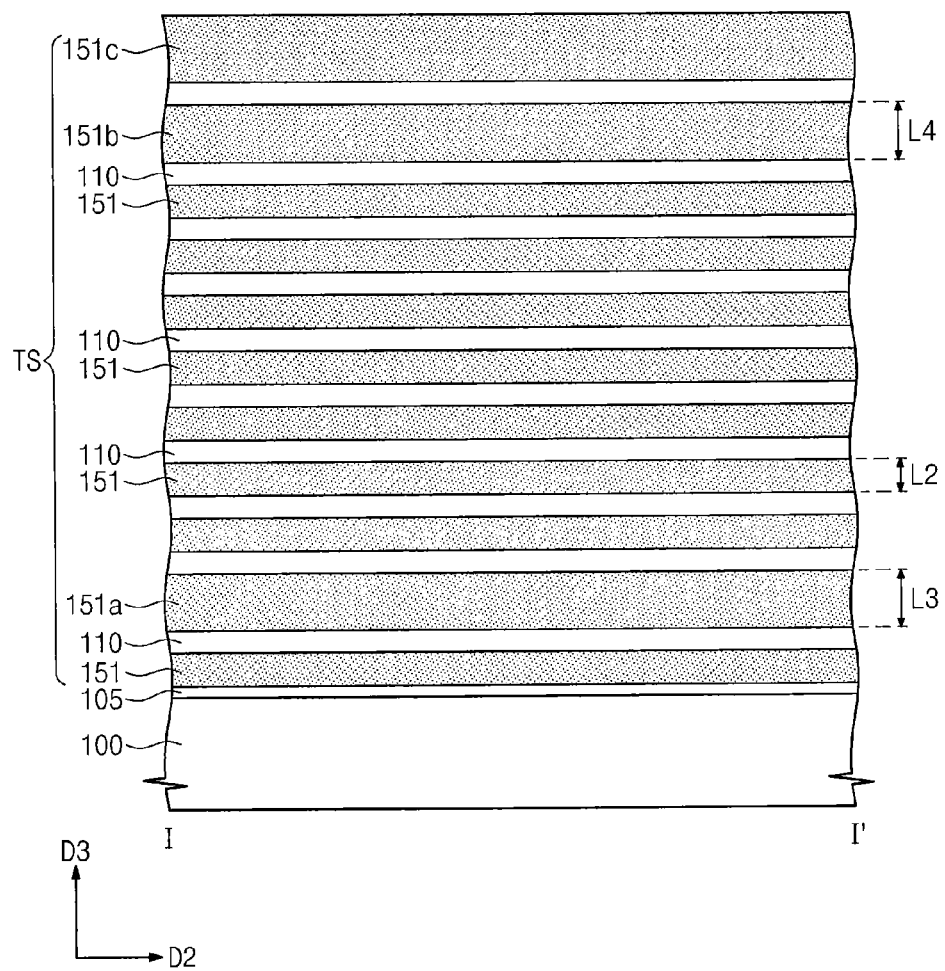
FIGS. 7, 12, 14, 16A, 19, and 24A are sectional views taken along line I-I' of FIGS. 6, 11, 13, 15, 18, and 23, respectively.

Referring to FIGS. 6 and 7, gate layers 151 and first insulating layers 110 may be alternately and repeatedly deposited on a substrate 100 to form a layered structure TS. The substrate 100 may be a silicon substrate, a germanium substrate, or a silicon-germanium substrate.

A lower insulating layer 105 may be formed to cover a top surface of the substrate 100. The lower insulating layer 105 may be formed of a material having high etch selectivity with respect to the gate layers 151 and the first insulating layers 110. As an example, the lower insulating layer 105 may be formed of or include at least one of a silicon nitride layer or high-k dielectric layers (e.g., aluminum oxide and hafnium oxide). The lower insulating layer 105 may be formed to be thinner than each of the gate layers 151 and the first insulating layers 110. Thereafter, the layered structure TS may be formed on the lower insulating layer 105.

The layered structure TS may include a lower gate layer 151a and an upper gate layer 151b, which are the lowermost and uppermost layers, respectively, of the gate layers 151. In addition, the layered structure TS may further include a mask layer 151c on the gate layers 151.

The lower gate layer 151a may be formed to have a third thickness L3, and the upper gate layer 151b may be formed to have a fourth thickness L4. The mask layer 151c may be formed to have a thickness that is greater than the thicknesses L3 and L4 of the lower gate layer 151a or the upper gate layer 151b.

The gate layers 151 may be formed to have substantially the same thickness. For example, each of the gate layers 151 may be formed to have a second thickness L2. Here, the second thickness L2 may be smaller (i.e., thinner) than the third and fourth thicknesses L3 and L4. The first insulating layers 110 may be formed to have substantially the same thickness.

The layered structure TS may be formed using a chemical vapor deposition (CVD) process or an atomic layer deposition (ALD) process. The gate layers 151, the lower and upper gate layers 151a and 151b, and the mask layer 151c may be formed of or include a polysilicon layer. The first insulating layers 110 may be formed of or include a silicon oxide layer.

Referring to FIGS. 8 and 9, channel holes CH may be formed to penetrate the layered structure TS and thereby to expose the substrate 100. When viewed in a plan view, the channel holes CH may be formed to form a zigzag arrangement in a first direction D1.

The formation of the channel holes CH may include forming a mask pattern, in which openings defining positions and shapes of the channel holes CH are formed, on the layered structure TS, and etching the layered structure TS using the mask pattern as an etch mask. The mask patterns may be formed of a material having a high etch selectivity with respect to the gate layers 151 and the first insulating layers 110. The etching process may be performed to etch a top surface of the substrate 100 in an over-etch manner. Accordingly, the top surface of the substrate 100 may be recessed. As a result of the etching process, the channel hole CH may be formed to have a lower width smaller than its upper width. Next, the mask pattern may be removed.

Referring to FIGS. 8 and 10, lower semiconductor patterns LSP may be formed to fill lower regions of the channel holes CH, respectively. The lower semiconductor patterns LSP may be formed by a selective epitaxial growth (SEG) process, in which the substrate 100 exposed by the channel holes CH is used as a seed layer. In this case, the lower semiconductor patterns LSP and the substrate 100 may be continuously connected to each other, thereby forming a single semiconductor structure.

The lower semiconductor patterns LSP may be pillar-shaped structures that extend upward from the top surface of the substrate 100 and fill the lower regions of the channel holes CH. For example, each of the lower semiconductor patterns LSP may be provided to cover an inner sidewall of the lower insulating layer 105, an inner sidewall of at least one of the gate layers 151, and an inner sidewall of at least one of the first insulating layers 110. The lower semiconductor patterns LSP may have top surfaces that are positioned between bottom and top surfaces of the lower gate layer 151a.

The lower semiconductor patterns LSP may have a single- or poly-crystalline structure. The lower semiconductor patterns LSP may be formed of or include silicon. The lower semiconductor patterns LSP may be formed to have substantially the same conductivity type as the substrate 100. For example, the lower semiconductor patterns LSP may be doped in situ with impurities during the selective epitaxial growth. In some embodiments, impurities may be injected into the lower semiconductor patterns LSP, after the formation of the lower semiconductor patterns LSP.

Figure 11:
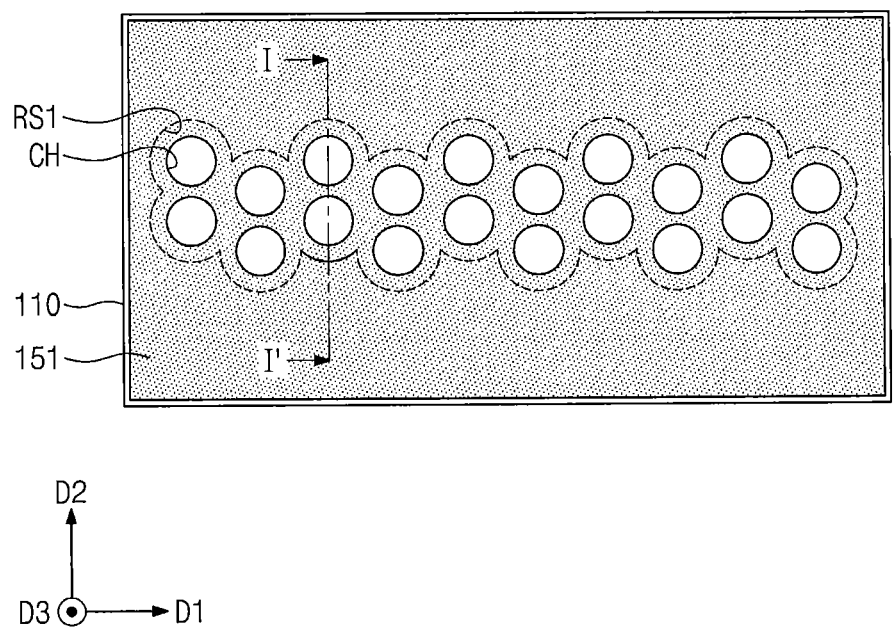
Figure 12:
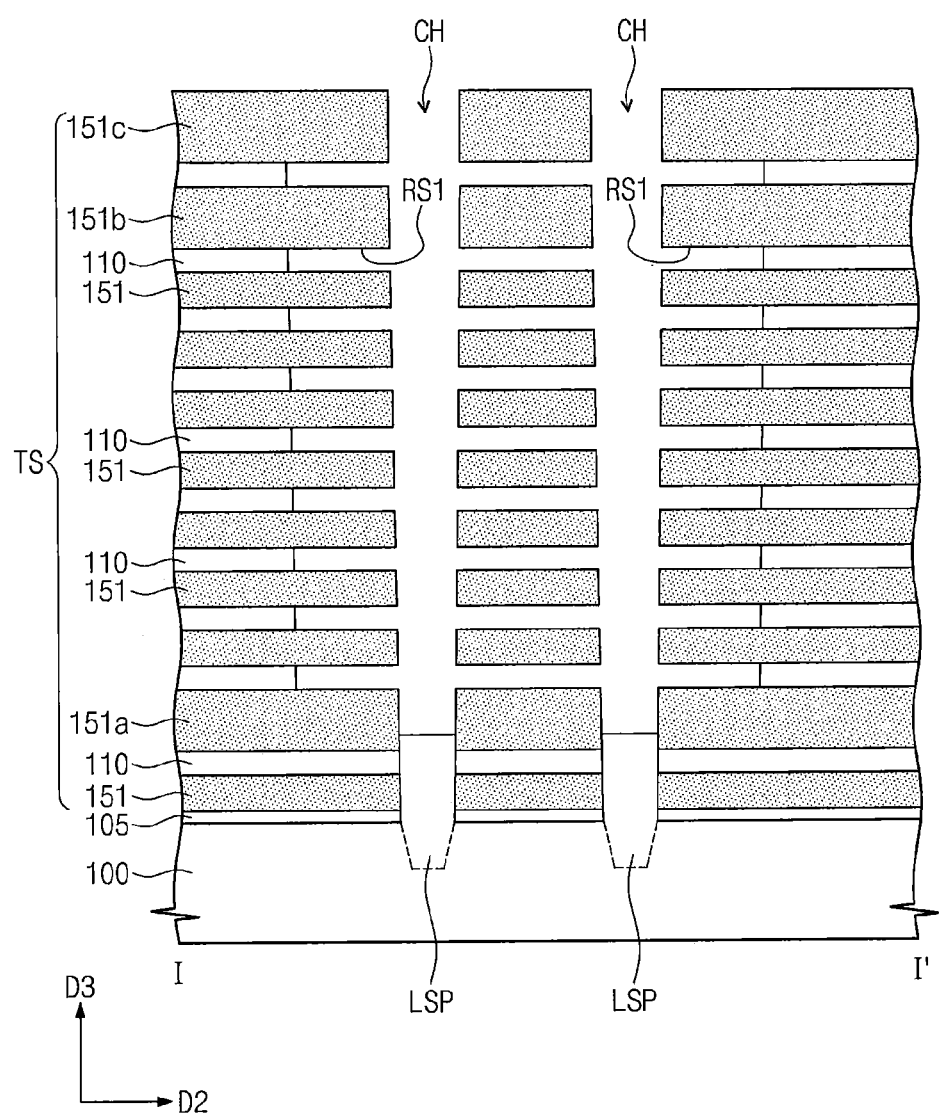

Referring to FIGS. 11 and 12, a trimming process may be performed to laterally etch the inner sidewalls of the first insulating layers 110 exposed by the channel holes CH. Accordingly, first recess regions RS 1 may be formed between the gate layers 151. The trimming process may be performed in an isotropic manner, and thus, the first insulating layers 110 may be laterally recessed to/in the same depth.

As shown in FIG. 11, the first recess regions RS1 at the same level may be connected to each other. In other words, the first insulating layers 110 may not be provided between adjacent ones of the channel holes CH.

Figure 13:
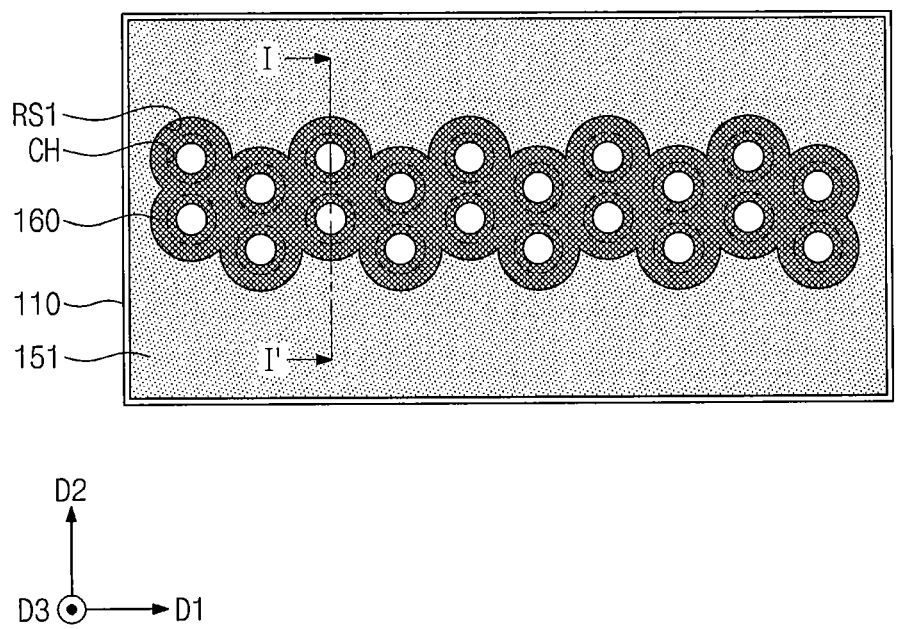
Figure 14:
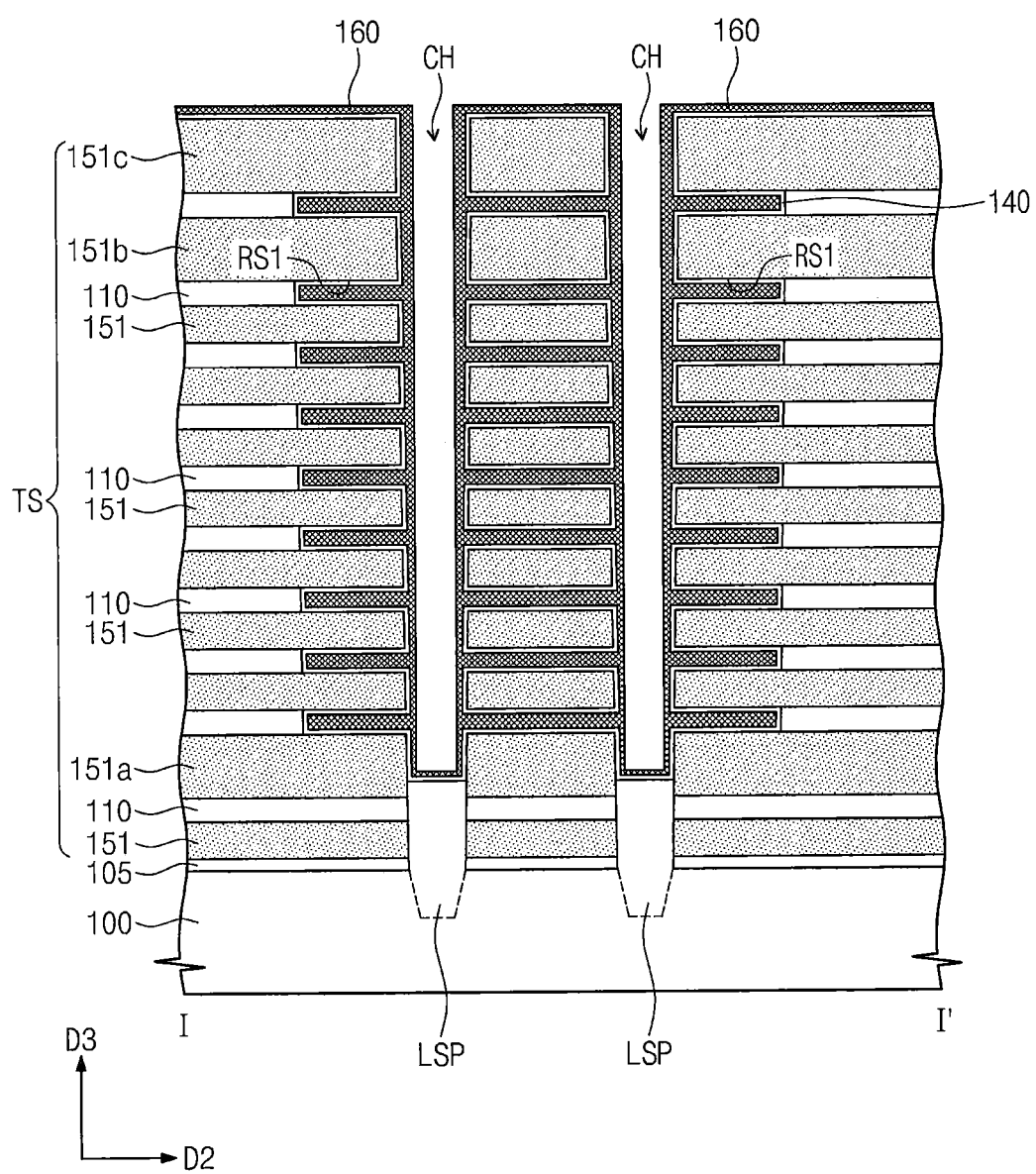

Referring to FIGS. 13 and 14, a blocking layer 140 may be formed to conformally cover the first recess regions RS1 and the channel holes CH. Thereafter, a sacrificial layer 160 may be formed on the blocking layer 140 to fill the first recess regions RS1 and the channel holes CH. The sacrificial layer 160 may be formed to completely fill the first recess regions RS1 provided with the blocking layer 140. However, the sacrificial layer 160 may be formed to partially fill the channel holes CH. The blocking layer 140 may be formed of or include a silicon oxide layer, and the sacrificial layer 160 may be formed of or include an n-type poly silicon layer.

Figure 16A:
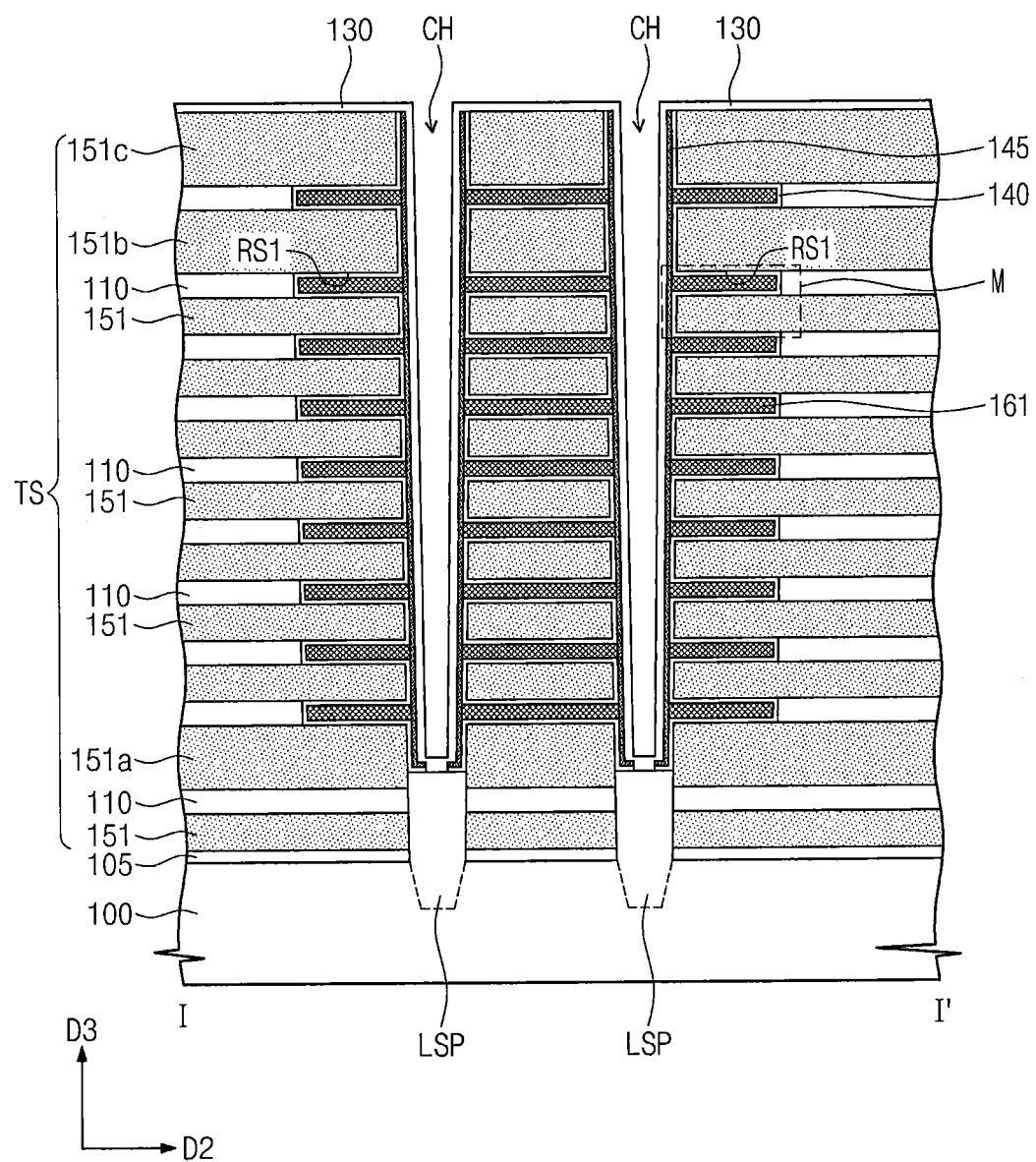
Figure 16B:
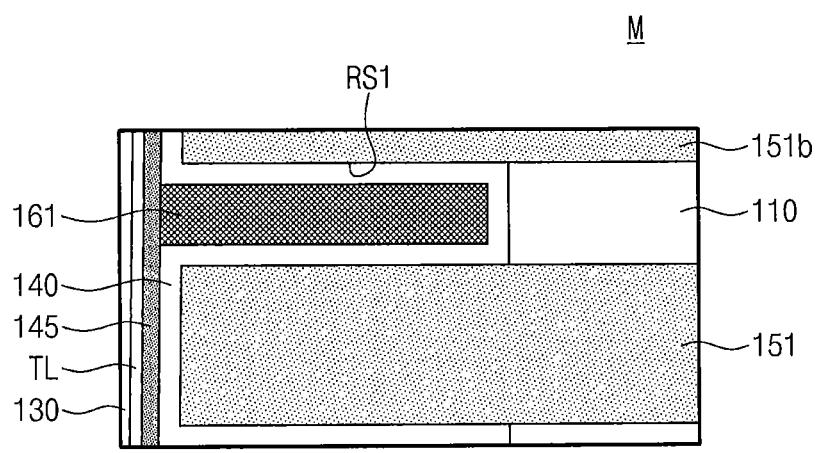
FIGS. 16B, 21B, 22B, 24B, 26B, and 27B are enlarged sectional views illustrating regions 'M' of FIGS. 16A, 21A, 22A, 24A, 26A, and 27A, respectively.

Referring to FIGS. 15, 16A, and 16B, the sacrificial layer 160 may be partially etched to form sacrificial patterns 161 in the first recess regions RS1. In other words, the process of etching the sacrificial layer 160 may be performed to remove the sacrificial layer 160 from the channel holes CH and to leave/provide a portion (e.g., a remaining portion) of the sacrificial layer 160 in each of the first recess regions RS1. The sacrificial patterns 161 may be spaced apart from each other in a vertical or third direction D3. When viewed in a plan view, each of the sacrificial patterns 161 may have a circular shape. Ones of the sacrificial patterns 161 at the same level (i.e., coplanar ones of the sacrificial patterns 161) may be connected to each other, thereby forming a single body enclosing the channel holes CH.

The partial etching of the sacrificial layer 160 may include oxidizing an exposed surface of the sacrificial layer 160 to form an oxide layer. Thereafter, the oxide layer may be selectively removed to leave/provide the sacrificial patterns 161 in the first recess regions RS1.

Thereafter, a charge storage layer 145 may be formed to conformally cover the inner sidewalls of the channel holes CH and the top surfaces of the lower semiconductor patterns LSP.

The charge storage layer 145 may be formed to partially fill each of the channel holes CH. At a region adjacent to the gate layers 151, the charge storage layer 145 may be formed to directly cover the blocking layer 140. The charge storage layer 145 may be formed of a silicon nitride layer, a silicon oxynitride layer, or a silicon-rich nitride layer. Referring again to FIG. 16B, a tunnel layer TL may be conformally formed on the charge storage layer 145. The tunnel layer TL may be formed of silicon oxide.

After the formation of the charge storage layer 145 and the tunnel layer TL, a channel layer 130 may be formed to pass through bottom portions of the tunnel layer TL, the charge storage layer 145, and the blocking layer 140, and here, the channel layer 130 may be connected to the lower semiconductor patterns LSP. The channel layer 130 may be formed to partially fill the channel holes CH. In other words, the channel layer 130 may be formed to have a deposition thickness smaller than a radius of the channel hole CH. The channel layer 130 may be formed by one of ALD and CVD processes and may be formed of a semiconductor material (e.g., a poly silicon layer, a single crystalline silicon layer, or an amorphous silicon layer).

For example, the formation of the channel layer 130 may include forming a first semiconductor layer to directly cover the tunnel layer TL. Thereafter, the first semiconductor layer, the tunnel layer TL, the charge storage layer 145, and the blocking layer 140 may be anisotropically etched to partially expose the top surfaces of the lower semiconductor patterns LSP. Next, a second semiconductor layer may be formed to cover the first semiconductor layer and the exposed top surfaces of the lower semiconductor patterns LSP (e.g., see FIG. 5B). The first and second semiconductor layers may constitute the channel layer 130.

The first semiconductor layer may protect/prevent portions of the tunnel layer TL, the charge storage layer 145, and the blocking layer 140 covered therewith from being etched in the anisotropic etching process. Accordingly, each of the tunnel layer TL, the charge storage layer 145, and the blocking layer 140 may have a bottom portion interposed between the channel layer 130 and the lower semiconductor patterns LSP. Furthermore, as a result of the anisotropic etching process, the top surface of the layered structure TS may be exposed. Accordingly, the tunnel layer TL and the charge storage layer 145 may be locally formed in each of the channel holes CH.

Referring to FIGS. 15 and 17, insulating gapfill patterns 150 may be formed on the channel layer 130. For example, an insulating gapfill layer may be formed to completely fill the channel holes CH. The insulating gapfill layer may be formed of at least one of various insulating materials, which can be formed by a spin-on-glass (SOG) technique, or a silicon oxide layer. Thereafter, the channel layer 130 and the insulating gapfill layer may be vertically recessed to form channel pillars 135 and insulating gapfill patterns 150, respectively, in the channel holes CH. Each of the channel pillars 135 may be formed to have a top-open pipe or macaroni structure.

Furthermore, conductive pads 137 may be formed on and connected to the channel pillars 135, respectively. The conductive pads 137 may be formed by filling the recessed regions of the channel pillars 135 and the insulating gapfill patterns 150 with a conductive material. As an example, the conductive pads 137 may be formed of a silicon layer, which is doped to have the same conductivity type as the substrate 100. The channel pillar 135 and the conductive pad 137 may constitute the channel structure CS. Thereafter, a planarization process may be performed on an upper portion of the layered structure TS, and the mask layer 151c and the first insulating layer 110 thereunder may be removed during the planarization process.

Figure 18:
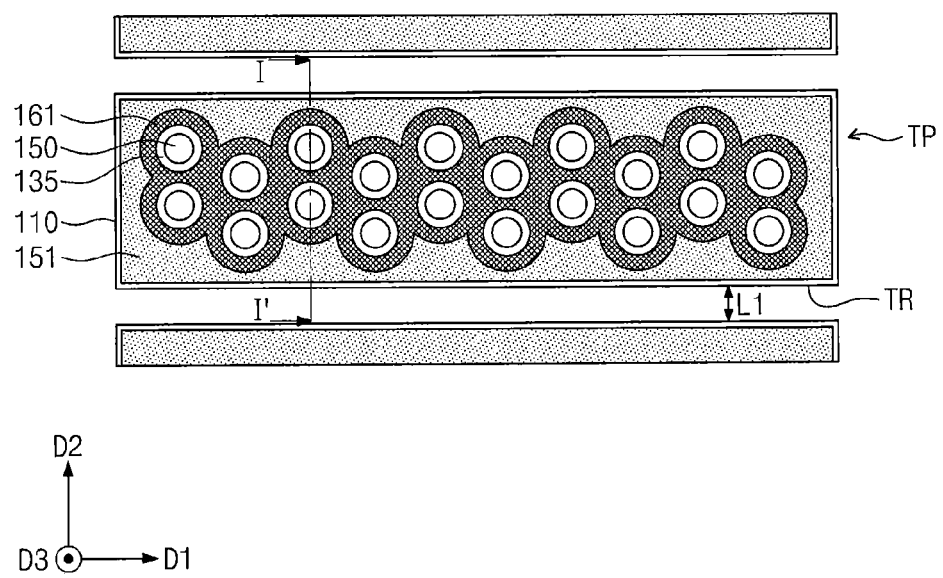
Figure 19:
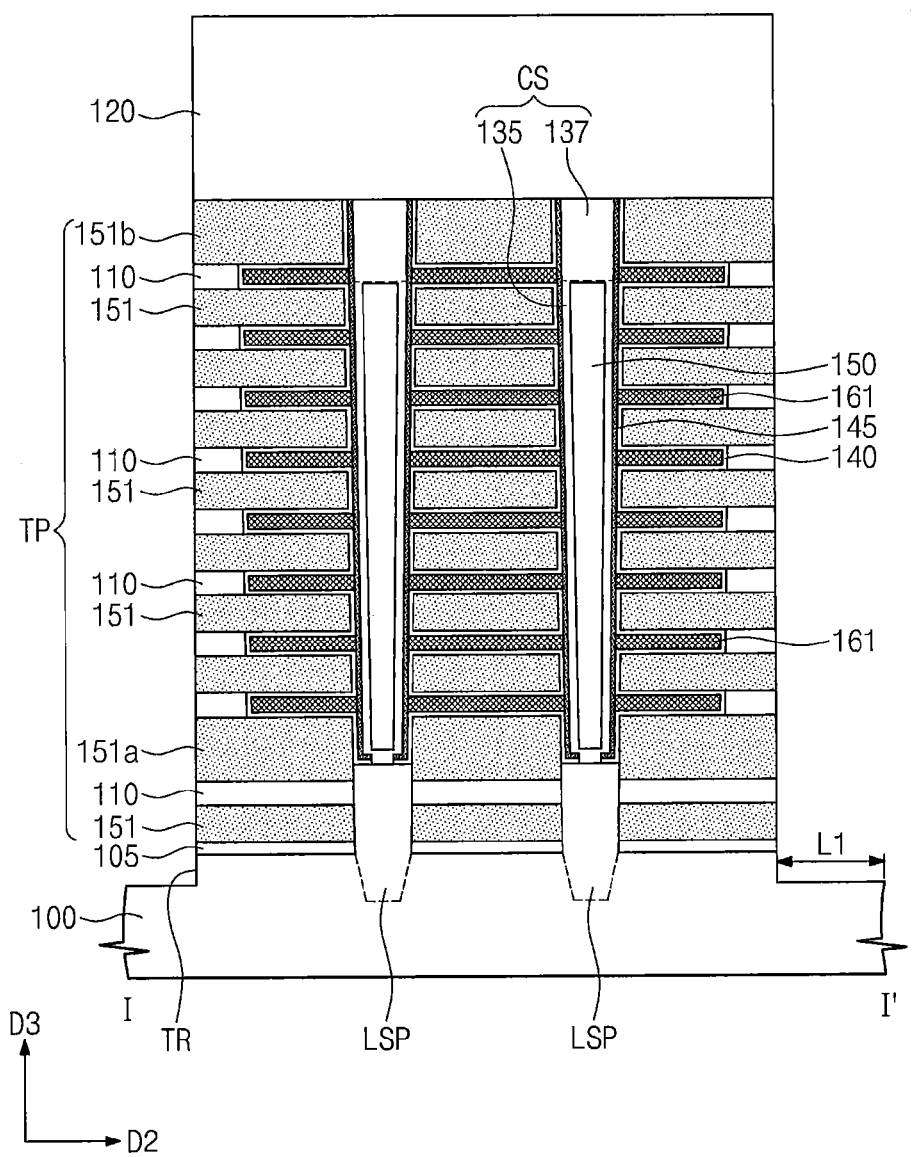

Referring to FIGS. 18 and 19, the layered structure TS may be patterned to form a line-shaped layered pattern TP extending in the first direction D1. During the patterning process, trenches TR may be formed in an upper portion of the substrate 100 and at both sides of the layered pattern TP. Each of the trenches TR may be formed to have a first width L1 in the second direction D2. The first width L1 may be greater than the third and fourth thicknesses L3 and L4 described with reference to FIG. 7.

In detail, the patterning of the layered structure TS may include forming a mask pattern (e.g., a third insulating layer 120) on the layered structure TS to define positions and shapes of the trenches TR and etching the layered structure TS using the mask pattern (e.g., a third insulating layer 120) as an etch mask.

Figure 21B:
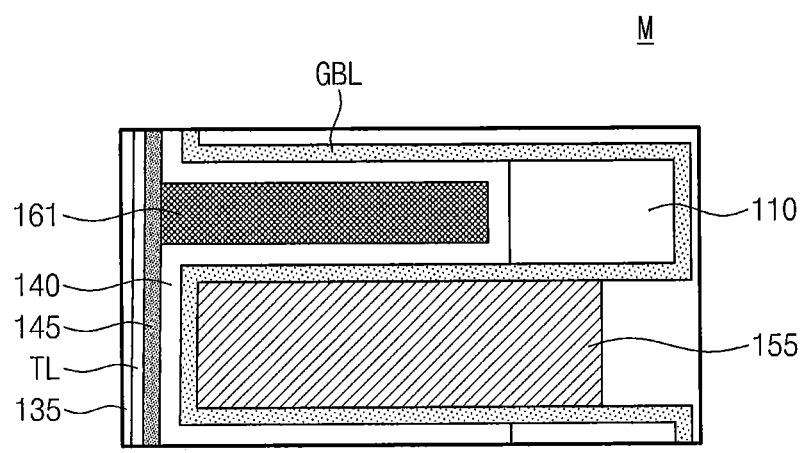

Referring to FIGS. 20, 21A, and 21B, a gate structure GS may be formed by replacing the gate layers 151 with gate lines 155. The gate layer 151 between the lower insulating layer 105 and the first insulating layer 110 may also be replaced with the gate line 155. However, the lower and upper gate layers 151a and 151b may be completely removed to form a second recess region RS2 and a third recess region RS3, respectively.

In detail, the gate layers 151 and the lower and upper gate layers 151a and 151b may be selectively and completely removed. Next, a conductive layer may be conformally formed to fill gate regions, which are formed by removing the gate layers 151, and second and third recess regions RS2 and RS3, which are formed by removing the lower and upper gate layers 151a and 151b. The conductive layer may be formed of or include at least one of metals (e.g., tungsten), metal nitrides, or metal silicides. Meanwhile, as previously described with reference to FIG. 7, the thicknesses L3 and L4 of the lower and upper gate layers 151a and 151b may be greater than the thickness L2 of each of the gate layers 151. Accordingly, the conductive layer may be formed to completely fill the gate regions but to partially fill the second and third recess regions RS2 and RS3. For example, in the second and third recess regions RS2 and RS3, the conductive layer may have a rotated "U" shaped section.

Next, the conductive layer may be isotropically etched until the conductive layer is completely removed from the second and third recess regions RS2 and RS3. Here, during the isotropic etching process, the conductive layer in the gate regions may be etched in only the second direction D2, and thus, even if the conductive layer is completely removed from the second and third recess regions RS2 and RS3, portions of the conductive layer may remain in the gate regions. The portions of the conductive layer remaining in the gate regions may be used as the gate lines 155. As a result of the isotropic etching process, outer sidewalls of the gate lines 155 may be recessed toward the channel structure CS. That is, the outer sidewalls of the gate lines 155 may be closer to the channel structure CS, compared with (i.e., relative to) outer side surfaces of the first insulating layers 110.

Gate insulating layers GI may be respectively formed on the exposed sidewalls of the lower semiconductor patterns LSP, after removing the lowermost layer of the gate layers 151 and before forming the conductive layer. For example, an oxidation process may be performed on the exposed sidewalls of the lower semiconductor patterns LSP, and in this case, the gate insulating layers GI may be formed of an oxide material (e.g., silicon oxide).

Referring again to FIG. 21B, before the formation of the conductive layer, a gate barrier layer GBL may be conformally formed on the substrate 100. In this case, the gate barrier layer GBL may be interposed between the blocking layer 140 and the gate lines 155. Furthermore, the gate barrier layer GBL may extend to cover outer sidewalls of the first insulating layers 110 and the third insulating layer 120. The gate barrier layer GBL may be formed of, for example, aluminum oxide or hafnium oxide.

If the lower and upper gate layers 151a and 151b were formed to have substantially the same thickness as the gate layers 151, the gate lines 155 could be formed in the second and third recess regions RS2 and RS3. In such a case, because a gate line 155 in the second recess region RS2 would be adjacent the lower semiconductor pattern LSP, a short circuit could be formed therebetween. Similarly, a short circuit could be formed between a gate line 155 in the third recess region RS3 and bit line plugs BPLG, which will be formed on the conductive pads 137. However, in a fabrication method according to some embodiments of present inventive concepts, the lower and upper gate layers 151a and 151b may be formed to be thicker than the gate layers 151, and thus, it is possible to impede/prevent the gate lines from being formed in the second and third recess regions RS2 and RS3. As a result, it is possible to reduce a process risk or to impede/prevent the short circuit from occurring.

Figure 22B:
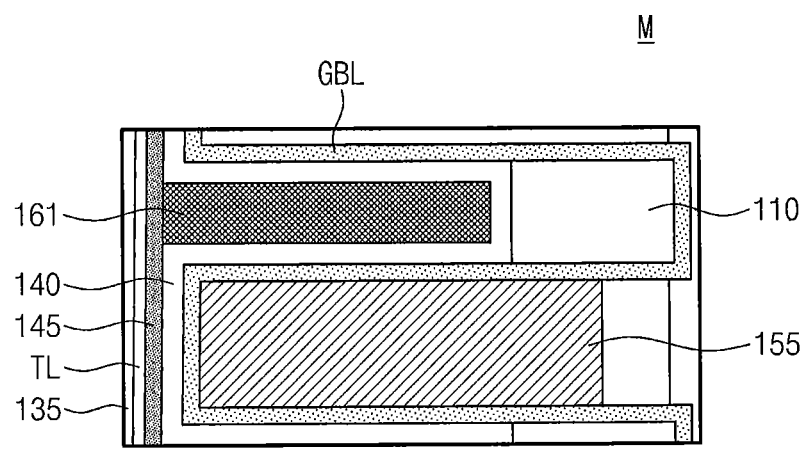
Figure 22C:
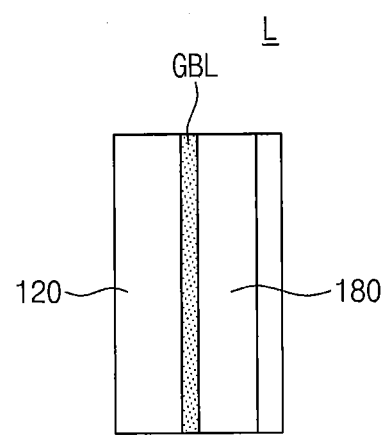
FIG. 22C is an enlarged sectional view of a portion/region 'L' of FIG. 22A.

Referring to FIGS. 20, 22A, and 22B, a fourth insulating layer 180 may be formed to cover the structure of FIG. 21B. The fourth insulating layer 180 may be formed to fill the second and third recess regions RS2 and RS3. The fourth insulating layer 180 may be formed of, for example, silicon oxide.

As previously described with reference to FIG. 19, the trenches TR may be formed to have a width L1 that is greater than thicknesses L3 and L4 of the lower and upper gate layers 151a and 151b. Accordingly, the fourth insulating layer 180 may be formed to completely fill the second and third recess regions RS2 and RS3. If the width L1 of the trenches TR is smaller than the thicknesses L3 and L4 of the lower and upper gate layers 151a and 151b, it may be difficult to fill the second and third recess regions RS2 and RS3 with the fourth insulating layer 180, because the trenches TR are filled in advance. For example, structural defects (e.g., voids) may be formed in the second and third recess regions RS2 and RS3.

Portions of the fourth insulating layer 180 adjacent to the first insulating layers 110 may be etched to expose the gate barrier layer GBL on the outer sidewalls of the first insulating layers 110. In some embodiments, by additionally depositing an insulating layer and controlling an etch recipe, the gate barrier layer GBL directly covering the third insulating layer 120 may be protected/prevented from being exposed when the fourth insulating layer 180 is etched.

Figure 23:
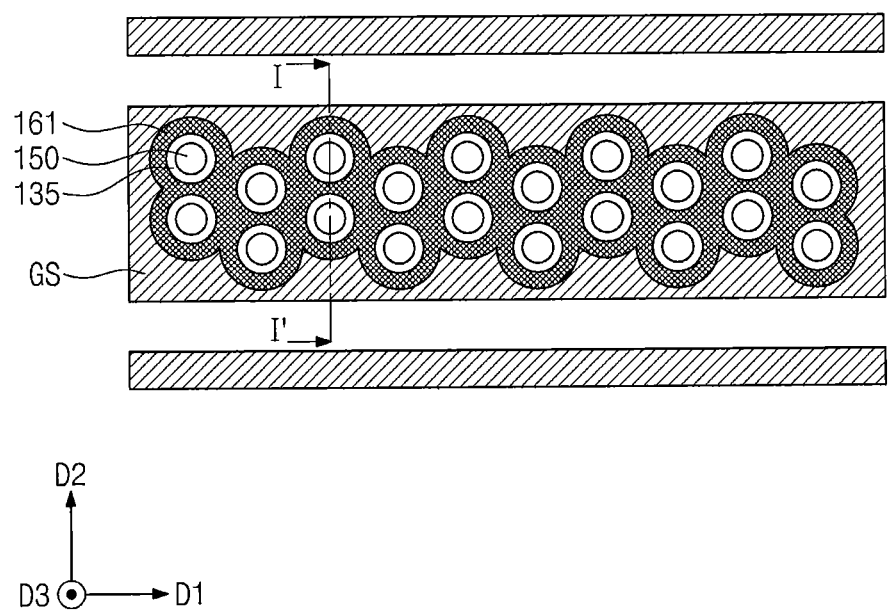
Figure 24A:
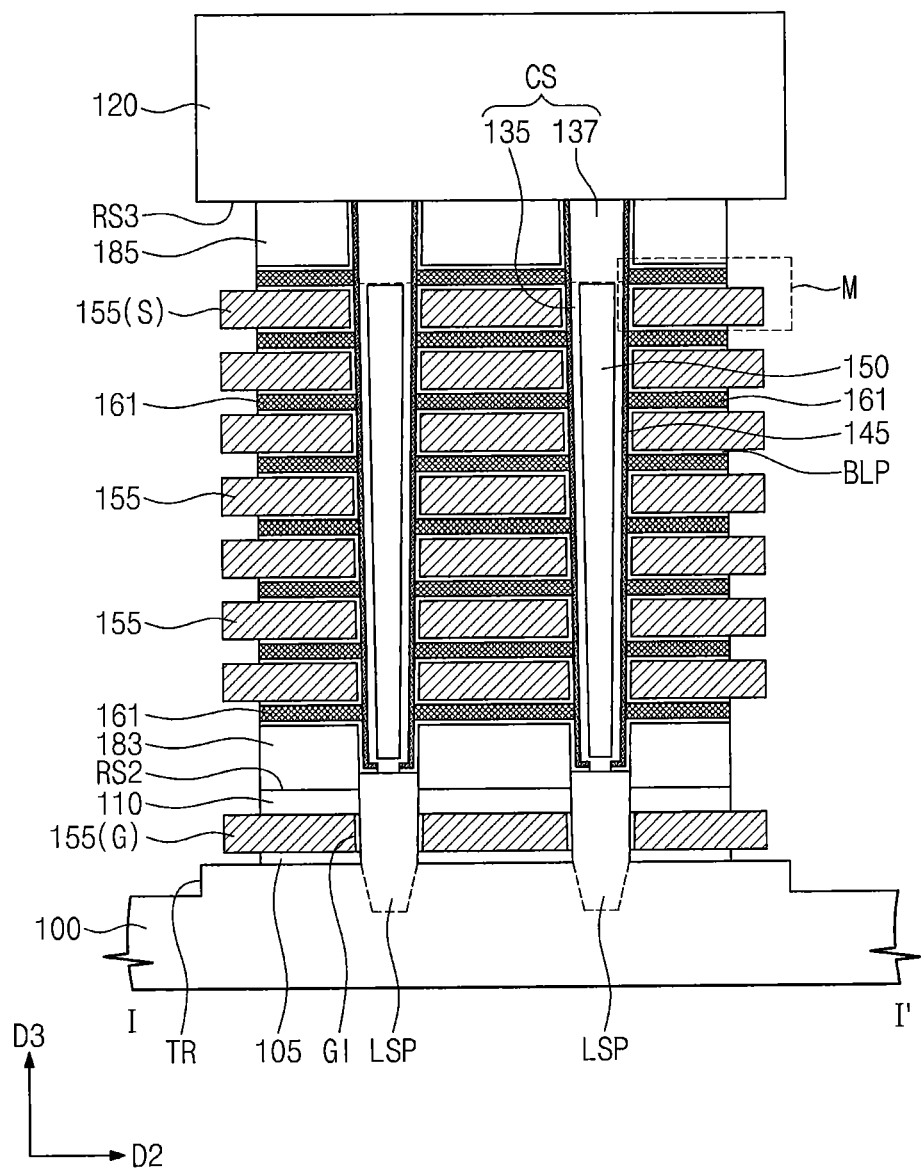
Figure 24B:
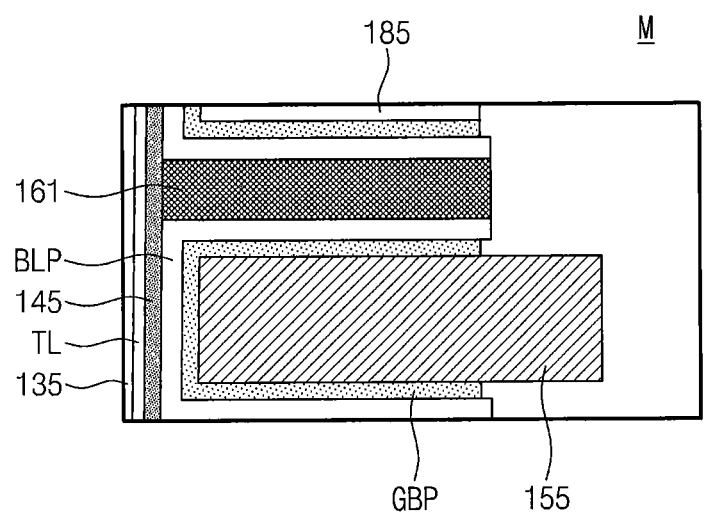

Referring to FIGS. 23, 24A, and 24B, the gate barrier layer GBL may be selectively etched to form gate barrier patterns GBP. For example, the etching of the gate barrier layer GBL may be performed to expose the outer sidewalls of the first insulating layers 110. In some embodiments, the gate barrier layer GBL covering the surface of the third insulating layer 120 may be protected/prevented from being etched, owing to the fourth insulating layer 180 previously described with reference to FIG. 22C.

Thereafter, the first insulating layers 110 and the blocking layer 140 may be sequentially recessed to expose the outer sidewalls of the sacrificial patterns 161. Here, the remaining portion of the fourth insulating layer 180 may be etched. For example, since all of the fourth insulating layer 180, the first insulating layers 110, and the blocking layer 140 include silicon oxide, they may be recessed by performing an etching process once. During the recess process, the third insulating layer 120 may be protected by the gate barrier layer GBL formed thereon.

During the recess process, the blocking layer 140 may be partially etched to form blocking patterns BLP. The blocking patterns BLP may be vertically spaced apart from each other with the sacrificial patterns 161 interposed therebetween. The recess process may be performed to leave/provide the fourth insulating layer 180 in the second and third recess regions RS2 and RS3, and as a result, lower and upper insulating patterns 183 and 185 may be formed in the second and third recess regions RS2 and RS3, respectively. In some embodiments, the recess process may be performed to partially expose each of the gate lines 155.

Referring to FIGS. 25 and 26A to 26C, the sacrificial patterns 161 may be removed to form fourth recess regions RS4. For example, the fourth recess regions RS4 may be formed between the gate lines 155, between the gate structure GS and the lower insulating pattern 183, and between the gate structure GS and the upper insulating pattern 185.

Since, as described above, the sacrificial patterns 161 are connected to each other to form a single body enclosing the channel structures CS, it is possible to remove all of the sacrificial patterns 161, even when only sidewalls of the sacrificial patterns 161 are exposed between the blocking patterns BLP. In other words, since the first recess regions RS1 are formed to be connected to each other, it is possible to remove all of the sacrificial patterns 161, regardless of positions of exposed portions of the sacrificial patterns 161.

As shown in FIG. 26C, the first insulating layers 110 between the gate lines 155 may remain on the contact region CTR described with reference to FIG. 2. For example, since the channel holes CH are not formed on the contact region CTR, the sacrificial patterns 161 may not be formed on the contact region CTR. Accordingly, although the first insulating layers 110 are partially recessed, most parts/portions of them may remain on the contact region CTR.

In the case where, unlike the afore-described fabrication process, the sacrificial patterns 161 are removed after completely removing the first insulating layers 110, there may be no layer capable of supporting the gate lines 155 on the contact region CTR. Accordingly, there is a risk of collapse of the gate lines 155 that are stacked to be spaced apart from each other. By contrast, in the fabrication method according to some embodiments of present inventive concepts, the first insulating layers 110 may remain on the contact region CTR, and thus, it is possible to protect/prevent the gate lines 155 from collapsing.

Figure 27B:
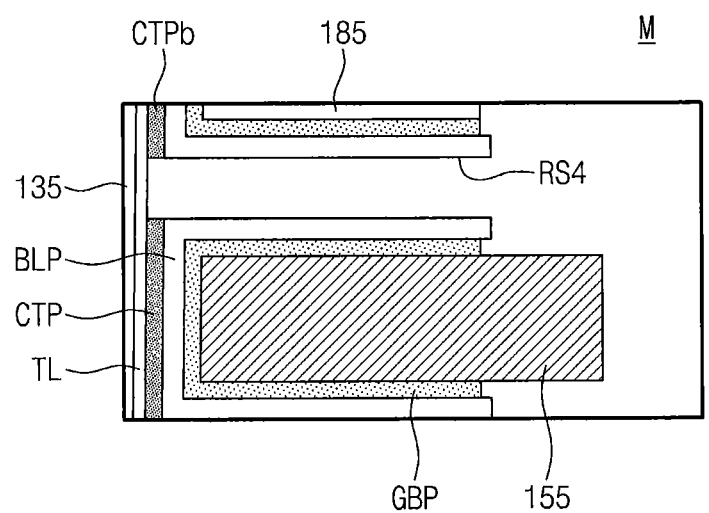

Referring to FIGS. 25, 27A, and 27B, portions of the charge storage layer 145 exposed by the fourth recess regions RS4 may be etched to form charge storage patterns CTP. For example, the charge storage patterns CTP may be locally formed between the gate lines 155 and the channel structures CS. In some embodiments, the charge storage patterns CTP may be vertically spaced apart from each other by the fourth recess regions RS4.

A lower charge storage pattern CTPa may be formed between the channel structure CS and the lower insulating pattern 183, and an upper charge storage pattern CTPb may be formed between the channel structure CS and the upper insulating pattern 185. The lower and upper charge storage patterns CTPa and CTPb may not be adjacent to the gate lines 155, unlike the charge storage patterns CTP.

Referring again to FIGS. 3, 4, 5A, and 5B, a second insulating layer 190 may be formed on the structure of FIG. 27A. The second insulating layer 190 may be formed to fill all of the fourth recess regions RS4. In addition, the second insulating layer 190 may cover the exposed outer portions of the gate lines 155. The second insulating layer 190 may be formed to cover sidewalls of the third insulating layer 120. Because the second insulating layer 190 may fill the fourth recess regions RS4 that are between the gate lines 155, the second insulating layer 190 may be referred to as an intergate insulating layer.

Common source regions DP may be formed in the trenches TR, before or after the formation of the second insulating layer 190. The common source regions DP may be formed by an ion implantation process. The common source regions DP may be formed to have a conductivity type different from the lower semiconductor patterns LSP. In other words, the common source regions DP, in conjunction with the substrate 100, may constitute pn junctions.

Next, common source lines CSL may be formed at both sides of the second insulating layer 190. Each of the common source lines CSL may be connected to the common source regions DP. An interlayer insulating layer 195 may be formed on the common source lines CSL and the third insulating layer 120. Bit line plugs BPLG may be formed to pass through the interlayer insulating layer 195 and the third insulating layer 120. The bit line plugs BPLG may be electrically connected to respective ones of the conductive pads 137. Bit lines BL may be formed on the bit line plugs BPLG. Each of the bit lines BL may be formed to connect a plurality of the bit line plugs BPLG to each other.

According to some embodiments of present inventive concepts, a semiconductor memory device may include charge storage patterns that are vertically spaced apart from each other. Accordingly, it is possible to impede/prevent electric charges or data stored in the charge storage pattern from being diffused or moved into neighboring ones of the charge storage patterns. Lower and upper insulating patterns, instead of gate lines, may be provided near lower and upper portions, respectively, of the channel structure. Accordingly, it is possible to impede/prevent a short circuit from occurring on a substrate or a contact plug.

Furthermore, in a fabrication method according to some embodiments of present inventive concepts, an insulating layer between the gate lines may be only partially removed during the formation of the charge storage patterns. Accordingly, it is possible to protect/prevent the gate lines on a contact region from collapsing.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
a substrate;
a gate structure on the substrate, the gate structure comprising gate lines that are stacked on the substrate and spaced apart from each other in a vertical direction;
a lower insulating pattern between the substrate and the gate structure;
a channel structure that extends through the gate structure and into the lower insulating pattern;
charge storage patterns between the channel structure and the gate lines; and
a lower charge storage pattern between the channel structure and the lower insulating pattern,
wherein the charge storage patterns are spaced apart from each other by first recess regions that are between the gate lines, and
wherein the lower charge storage pattern is spaced apart from a nearest one of the charge storage patterns by a second recess region that is between the lower insulating pattern and the gate structure.

2. The device of claim 1, wherein the lower charge storage pattern comprises:
a first portion between a sidewall of the channel structure and a sidewall of the lower insulating pattern, the first portion extending in the vertical direction; and
a second portion between the substrate and the channel structure, the second portion extending in a direction parallel to a top surface of the substrate.

3. The device of claim 1, wherein the channel structure comprises a bottom surface that is between bottom and top surfaces of the lower insulating pattern in the vertical direction.

4. The device of claim 1, further comprising an insulating layer filling the first and second recess regions.

5. The device of claim 1, wherein:
the lower insulating pattern comprises a first thickness;
each of the gate lines comprises a second thickness; and
the first thickness is thicker than the second thickness.

6. The device of claim 5,
wherein the substrate comprises a trench in a top portion thereof and adjacent a side of the gate structure, and
wherein the trench comprises a width greater than the first thickness.

7. The device of claim 1, further comprising a tunnel layer between the channel structure and the lower charge storage pattern and between the channel structure and the charge storage patterns,
wherein the tunnel layer contacts a sidewall of the channel structure.

8. The device of claim 1, further comprising blocking patterns that are respectively between the lower insulating pattern and the lower charge storage pattern and between the gate lines and the charge storage patterns.

9. The device of claim 8, wherein one of the blocking patterns extends onto top and bottom surfaces of an adjacent one of the gate lines.

10. The device of claim 1,
wherein the substrate comprises a lower semiconductor pattern that protrudes beyond a surface of the substrate, and
wherein the channel structure contacts a top surface of the lower semiconductor pattern.

11. The device of claim 10, further comprising a ground selection line between the substrate and the lower insulating pattern,
wherein the lower semiconductor pattern extends through the ground selection line.

12. A semiconductor device, comprising:
a substrate;
a lower insulating pattern, a gate structure comprising a plurality of gate lines, and an upper insulating pattern sequentially stacked on the substrate;
an insulating layer filling spaces between the lower insulating pattern, the gate lines, and the upper insulating pattern;
a channel structure in the upper insulating pattern, the gate structure, and the lower insulating pattern;
a lower charge storage pattern between the channel structure and the lower insulating pattern;
charge storage patterns between the channel structure and the gate lines; and
an upper charge storage pattern between the channel structure and the upper insulating pattern,
wherein the lower charge storage pattern, the charge storage patterns, and the upper charge storage pattern are vertically spaced apart from each other with the insulating layer interposed therebetween.

13. The device of claim 12, wherein the lower charge storage pattern comprises:
a first portion between a sidewall of the channel structure and a sidewall of the lower insulating pattern, the first portion extending in a vertical direction; and
a second portion between the substrate and the channel structure, the second portion extending in a direction parallel to a top surface of the substrate.

14. The device of claim 12, wherein the upper charge storage pattern is between a sidewall of the channel structure and a sidewall of the upper insulating pattern and extends in a vertical direction.

15. The device of claim 12, wherein the upper and lower insulating patterns comprise first and second thicknesses, respectively, that are thicker than any of the gate lines.

* * * * *